(12) United States Patent
Esquius Morote

(10) Patent No.: US 11,990,893 B2
(45) Date of Patent: May 21, 2024

(54) ELECTROACOUSTIC FILTER WITH LOW PHASE DELAY FOR MULTIPLEXED SIGNALS

(71) Applicant: RF360 SINGAPORE PTE. LTD., Singapore (SG)

(72) Inventor: Marc Esquius Morote, Munich (DE)

(73) Assignee: RF360 Singapore Pte. Ltd., Singapore (SG)

( * ) Notice: Subject to any disclaimer, the term of this patent is extended or adjusted under 35 U.S.C. 154(b) by 557 days.

(21) Appl. No.: 17/165,793

(22) Filed: Feb. 2, 2021

(65) Prior Publication Data

US 2022/0247385 A1    Aug. 4, 2022

(51) Int. Cl.
*H03H 9/64* (2006.01)
*H03H 9/25* (2006.01)
*H03H 9/72* (2006.01)

(52) U.S. Cl.
CPC ............ *H03H 9/6406* (2013.01); *H03H 9/25* (2013.01); *H03H 9/72* (2013.01)

(58) Field of Classification Search
CPC .......... H03H 9/6406; H03H 9/25; H03H 9/72; H03H 9/542; H03H 9/605; H03H 9/6483; H03H 9/706; H03H 9/725; H03H 9/568; H03H 9/64; H03H 9/0547; H03H 3/02; H03H 3/08; H03H 7/42; H03H 9/0523; H03H 9/0552; H03H 9/0561; H03H 9/0571; H03H 9/0576; H03H 9/059; H03H 9/14597; H03H 9/703; H04B 1/0057; H04B 1/18; H04B 1/0458; H04B 1/48; H04B 1/525; H04B 2001/0408; H04B 1/1036;

(Continued)

(56) References Cited

U.S. PATENT DOCUMENTS 11,563,423 B2 *  1/2023  Komatsu ............ H03H 9/02102
2008/0252397 A1  10/2008  Stuebing et al.
(Continued)

FOREIGN PATENT DOCUMENTS

| EP | 1003287 A1 | 5/2000 |
|---|---|---|
| JP | 2018129680 A | 8/2018 |
| WO | 2020201057 A1 | 10/2020 |

OTHER PUBLICATIONS

International Search Report and Written Opinion—PCT/EP2022/051908—ISA/EPO—dated May 31, 2022.

*Primary Examiner* — Lincoln D Donovan
*Assistant Examiner* — Tyler J Pereny
(74) *Attorney, Agent, or Firm* — Polsinelli

(57) ABSTRACT

Aspects of the disclosure relate to wireless communication, and high-frequency filters with resonators configured to systematically modify phase characteristics of an antenna reflection coefficient. One aspect is a wireless communication apparatus comprising an acoustic resonator having a first resonator side and a second resonator side, the first resonator side coupled to a first signal connection port, a first capacitor including a first side coupled to the first resonator side and the first signal connection port, the first capacitor further including a second side coupled to a ground connection port, and a second capacitor including a first side coupled to the ground connection port, the second capacitor further including a second side, the second resonator side and the second side of the second capacitor coupled to an output port.

25 Claims, 13 Drawing Sheets

(58) Field of Classification Search
CPC ..... H04B 1/04; H04B 1/10; H01L 2223/6677;
H01L 2224/0401; H01L 23/481; H01L
23/5226; H01L 23/5227; H01L 23/66;
H01L 2223/6616; H01L 2223/6661;
H01L 2224/0233; H01L 2224/02372
See application file for complete search history.

(56) References Cited

U.S. PATENT DOCUMENTS

| | | |
|---|---|---|
| 2017/0264268 A1 | 9/2017 | Schmidhammer |
| 2018/0226952 A1* | 8/2018 | Tanaka ................... H03H 9/568 |
| 2018/0234079 A1 | 8/2018 | Takamine et al. |
| 2019/0319772 A1* | 10/2019 | Ando ...................... H03H 9/725 |
| 2020/0145030 A1 | 5/2020 | Takamine |
| 2020/0177156 A1 | 6/2020 | Jachowski et al. |
| 2021/0159881 A1* | 5/2021 | Caron ...................... H04B 1/40 |
| 2021/0265979 A1* | 8/2021 | Inoue .................... H03H 9/542 |
| 2023/0253989 A1* | 8/2023 | Kido ........................ H04B 1/40 |
| | | 455/552.1 |

* cited by examiner

ELECTROACOUSTIC FILTER WITH LOW PHASE DELAY FOR MULTIPLEXED SIGNALS

FIELD

The present disclosure relates generally to wireless communication, and in particular to filters with low phase delay that can be implemented with electroacoustic resonators and that can be used in a multi-band communication device.

BACKGROUND

Electronic devices include traditional computing devices such as desktop computers, notebook computers, tablet computers, smartphones, wearable devices like a smartwatch, interne servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast and so on. These systems may be capable of supporting communication with multiple users by sharing the available system resources (e.g., time, frequency, and power). Aspects of such systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system).

Wireless communication transceivers used in these electronic devices generally include multiple radio frequency (RF) filters for filtering a signal for a particular frequency or range of frequencies. Electroacoustic devices (e.g., "acoustic filters") are used for filtering high-frequency (e.g., generally greater than 100 MHz) signals in many applications. Using a piezoelectric material as a vibrating medium, acoustic resonators operate by transforming an electrical signal wave that is propagating along an electrical conductor into an acoustic wave that is propagating via the piezoelectric material. The acoustic wave propagates at a velocity having a magnitude that is significantly less than that of the propagation velocity of the electromagnetic wave. Generally, the magnitude of the propagation velocity of a wave is proportional to a size of a wavelength of the wave. Consequently, after conversion of an electrical signal into an acoustic signal, the wavelength of the acoustic signal wave is significantly smaller than the wavelength of the electrical signal wave. The resulting smaller wavelength of the acoustic signal enables filtering to be performed using a smaller filter device. The smaller filter device permits acoustic resonators to be used in electronic devices having size constraints, such as the electronic devices enumerated above (e.g., particularly including portable electronic devices such as cellular phones).

SUMMARY

Aspects of the present disclosure describe filter circuits for with low phase delay for multi-band communication systems. Communication technologies are changing to improve communication performance by using additional frequency bands with associated filters. To implement additional frequency usage, the number of bands in use by a single transceiver circuit can be increased. In such devices, different RF filters can be coupled to a single antenna to efficiently use device resources. Aspects of the disclosure described herein include devices and communication apparatuses with electroacoustic filters. The devices and apparatuses provide filtering with low phase delay for frequency bands at frequencies up to 8 GHz, or at similar frequency ranges (e.g., LTE sub-6 GHz bands, 5G 3GPP bands, Unlicensed National Information Infrastructure (U-NII) bands between 5.15 GHz and 7.125 GHz, other or future bands created near 8 GHz, etc.) depending on component selection. The devices and wireless communication apparatuses described herein can improve device performance to meet thresholds associated with communication standards for certain multi-band communication systems, while using a relatively small amount of device space.

In one illustrative example, a wireless communication apparatus is provided. The wireless communication apparatus comprises means for generating a resonance having a first resonator side and a second resonator side; processing circuitry coupled to the first resonator side; a first capacitor including a first side coupled to the first resonator side and the processing circuitry, the first capacitor further including a second side; a first inductor having a first side coupled to the second side of the first capacitor; a ground element coupled to a second side of the first inductor; a second capacitor including a first side coupled to a second side of the first inductor, the second capacitor further including a second side coupled to the second resonator side; a second inductor having a first side coupled the second resonator side and the second side of the second capacitor; and an antenna coupled to a second side of the second inductor.

In another illustrative example, a wireless device is provided. The wireless device comprises an acoustic resonator having a first resonator side and a second resonator side; processing circuitry coupled to the first resonator side; a first capacitor including a first side coupled to the first resonator side and the processing circuitry, the first capacitor further including a second side; a first inductor having a first side coupled to the second side of the first capacitor; a ground element coupled to a second side of the first inductor; a second capacitor including a first side coupled to a second side of the first inductor, the second capacitor further including a second side coupled to the second resonator side; and a second inductor having a first side coupled the second resonator side and the second side of the second capacitor.

In another illustrative example, a method of filtering a signal in a wireless communication apparatus is described. The method comprises receiving the signal at a first filter of the wireless communication apparatus, the first filter including: an acoustic resonator having a first resonator side and a second resonator side; a first capacitor including a first side coupled to the first resonator side, the first capacitor further including a second side; a first inductor having a first side coupled to the second side of the first capacitor; a ground element coupled to a second side of the first inductor; a second capacitor including a first side coupled to a second side of the first inductor, the second capacitor further including a second side coupled to the second resonator side; a second inductor having a first side coupled the second resonator side and the second side of the second capacitor; and filtering the signal using the first filter, wherein filtering provides low phase delay filtering for a frequency band associated with the first filter.

In another illustrative example, a wireless communication apparatus is provided. The wireless communication apparatus comprises: an acoustic resonator having a first resonator side and a second resonator side, the first resonator side coupled to a first signal connection port; a first capacitor including a first side coupled to the first resonator side and the first signal connection port, the first capacitor further including a second side coupled to a ground connection port; and a second capacitor including a first side coupled to the ground connection port, the second capacitor further including a second side, the second resonator side and the second side of the second capacitor coupled to an output port.

In some aspects, the acoustic resonator, the first signal connection port, the first capacitor, the ground connection port, the second capacitor, and the output port are integrated in an acoustic die.

In some aspects, the first capacitor has a first capacitance value within a threshold tolerance of a range from 0.1 picofarads (pF) to 0.7 pF, and wherein the second capacitor has a second capacitance value within the threshold tolerance of the range from 0.1 pF to 0.7 pF. In some aspects, the threshold tolerance is five percent.

In some aspects, a wireless communication apparatus further comprises a first inductor coupled between the ground connection port and a ground element; and a second inductor coupled to the output port. In some aspects, the first inductor has an inductance value within a threshold tolerance between 0.5 nanohenries (nH) and 3 nH, and wherein the second inductor has an inductance value within a threshold tolerance between 1 nH and 5 nH. In some aspects, the first inductor is integrated in a laminate between the ground element and the acoustic die.

In some aspects, the wireless communication apparatus further comprises a first filter, the first filter including the acoustic resonator, the first capacitor, the second capacitor, the first inductor, and the second inductor, wherein an input side of the first filter is connected to the first resonator side, and wherein an antenna side of the first filter is connected to a second side of the second inductor.

In some aspects, the acoustic resonator is a bulk acoustic wave resonator. In some aspects, the acoustic resonator is a thin-film surface acoustic wave (SAW) resonator.

In some aspects, the apparatuses described above can include a mobile device with a camera for capturing one or more pictures. In some aspects, the apparatuses described above can include a display for displaying one or more pictures. The summary is not intended to identify key or essential features of the claimed subject matter, nor is it intended to be used in isolation to determine the scope of the claimed subject matter. The subject matter should be understood by reference to appropriate portions of the entire specification, any or all drawings, and each claim.

The foregoing, together with other features and embodiments, will become more apparent upon referring to the following specification, claims, and accompanying drawings.

DETAILED DESCRIPTION

Figures 1A, 1B:
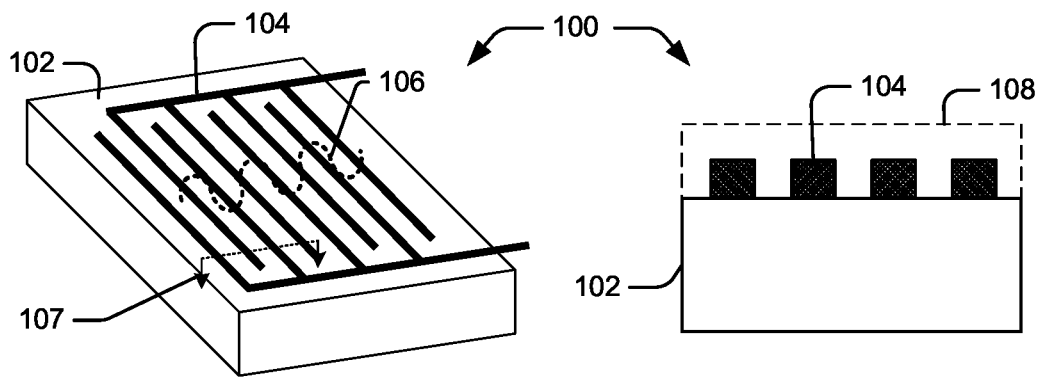
FIG. 1A is a diagram of a perspective view of an example of an electroacoustic device for use with some examples described herein.
FIG. 1B is a diagram of a side view of the electroacoustic device of FIG. 1A.

The detailed description set forth below in connection with the appended drawings is intended as a description of exemplary implementations and is not intended to represent the only implementations in which the invention may be practiced. The term "exemplary" used throughout the description means "serving as an example, instance, or illustration," and should not necessarily be construed as preferred or advantageous over other exemplary implementations. The detailed description includes specific details for the purpose of providing a thorough understanding of the exemplary implementations. In some instances, some devices are shown in block diagram form. Drawing elements that are common among the following figures may be identified using the same reference numerals.

Aspects described herein include devices and wireless communication apparatuses that can use a specific filter topology with an electroacoustic resonator and/or other such resonators to create a filter with a low phase delay. The low phase delay can be configured over communication frequencies to allow multiplexing of frequency bands up to about 8 GHz. The example devices and wireless communication apparatuses described herein include the filter topology to limit out of band dispersion, to improve performance, and to meet standards thresholds when combining multiple frequency bands. For example, some devices (e.g., smartphones) are configured to transmit and receive signals on both legacy Long Term Evolution (LTE) standard frequency bands, as well as new 5th generation (e.g., 5G) frequency bands, which are at a higher frequency range than the previous LTE frequency bands. Filters for the different frequency bands can interact through multiplexers that couple signals from multiple bands to a single antenna. To maintain performance, certain thresholds are used, including dispersion characteristics for filters at each frequency band. As additional bands are added to existing multi-band systems, current filters and multiplexers may not meet performance thresholds. In particular, certain LTE band diplexers use filters that do not meet performance thresholds when a third frequency band is added and the diplexer changed to a triplexer to couple a new band to a shared antenna. In some examples, a filter with improved device operation in such an environment is provided, where a lower phase delay over LTE and 5G frequency bands can be configured to reduce out of band dispersion and improve performance. Such device improvements can, in some examples, be generated while maintaining or improving space utilization, providing additional improvements to the function of a device.

Electroacoustic devices such as bulk acoustic wave (BAW) resonators, which use layers of resonant materials, and surface acoustic wave (SAW) resonators, which employ electrode structures on a surface of a piezoelectric material, are being designed to cover more frequency ranges (e.g., 500 MHz to 6 GHz), to have higher bandwidths (e.g., up to 25%), and to have improved efficiency and performance. In general, certain SAW resonators are designed to cause propagation of an acoustic wave in a particular direction through the piezoelectric material (e.g., main acoustic wave mode).

In addition to the SAW devices described herein, other resonators can be used in RF filters in accordance with the examples described herein. For example, bulk acoustic wave (BAW) or thin-film bulk acoustic resonator (FBAR or TFBAR) devices include a piezoelectric material manufactured with thin films sandwiched between two electrodes and isolated from vibrations in a surrounding substrate. The piezoelectric films of such devices can have thicknesses in the range of several micrometers down to fractions of a micrometer, and can resonate in frequency ranges above 100 Megahertz (MHz). As described herein, SAW, BAW, and other devices can be referred to as resonators or electroacoustic resonators. Aspects of the present disclosure are directed to radio frequency (RF) filters for filtering a signal for a particular frequency or range of frequencies, particularly in a multi-band context, where multiple filters can be used to send signals to a shared antenna. Aspects of the present disclosure use resonant structures added to RF filters to modify the phase characteristics of the antenna reflection coefficients for the filters to reduce the interactions that different (e.g., counter) band-signals have with the particular filter, and thereby improve communication performance.

FIG. 1A is a diagram of a perspective view of an example of an electroacoustic device 100. The electroacoustic device 100 may be configured as or be a portion of a SAW resonator. In certain descriptions herein, the electroacoustic device 100 may be referred to as a SAW resonator. However, there may be other electroacoustic device types (e.g., BAW or TFBAR) that may be constructed based on the principles described herein. The electroacoustic device 100 includes an electrode structure 104, that may be referred to as an interdigital transducer (IDT), on the surface of a piezoelectric material 102. The electrode structure 104 generally includes first and second comb shaped electrode structures (conductive and generally metallic) with electrode fingers extending from two busbars towards each other arranged in an interlocking manner in between two busbars (e.g., arranged in an interdigitated manner). An electrical signal excited in the electrode structure 104 (e.g., applying an AC voltage) is transformed into an acoustic wave 106 that propagates in a particular direction via the piezoelectric material 102. The acoustic wave 106 is transformed back into an electrical signal and provided as an output. In many applications, the piezoelectric material 102 has a particular crystal orientation such that when the electrode structure 104 is arranged relative to the crystal orientation of the piezoelectric material 102, the acoustic wave mainly propagates in a direction perpendicular to the direction of the fingers (e.g., parallel to the busbars).

FIG. 1B is a diagram of a side view of the electroacoustic device 100 of FIG. 1A along a cross-section 107 shown in FIG. 1A. The electroacoustic device 100 is illustrated by a simplified layer stack including a piezoelectric material 102 with an electrode structure 104 disposed on the piezoelectric material 102. The electrode structure 104 is conductive and generally formed from metallic materials. The piezoelectric material may be formed from a variety of materials such as quartz, lithium tantalate (LiTaO3), lithium niobite (LiNbO3), doped variants of these, or other piezoelectric materials. It should be appreciated that more complicated layer stacks (e.g., 4 stacks, 6 stacks, etc.) including layers of various materials may be possible within the stack. For example, optionally, a temperature compensation layer 108 denoted by the dashed lines may be disposed above the electrode structure 104. The piezoelectric material 102 may be extended with multiple interconnected electrode structures disposed thereon to form a multi-resonator filter or to provide multiple filters. While not illustrated, when provided as an integrated circuit component, a cap layer may be provided over the electrode structure 104. The cap layer is applied so that a cavity is formed between the electrode structure 104 and an under surface of the cap layer. Electrical vias or bumps that allow the component to be electrically connected to connections on a substrate (e.g., via flip-chip or other techniques) may also be included.

Figure 2A:
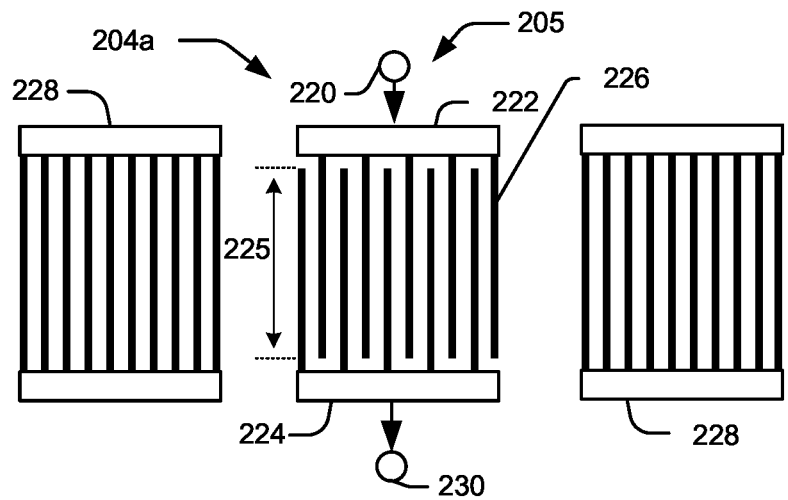
FIG. 2A is a diagram of a top view of an example of an electrode structure of an electroacoustic device for use with some examples described herein.

FIG. 2A is a diagram of a top view of an example of an electrode structure 204a of an electroacoustic device 100. The electrode structure 204a has an IDT 205 that includes a first busbar 222 (e.g., first conductive segment or rail) electrically connected to a first terminal 220 and a second busbar 224 (e.g., second conductive segment or rail) spaced from the first busbar 222 and connected to a second terminal 230. A plurality of conductive fingers 226 are connected to either the first busbar 222 or the second busbar 224 in an interdigitated manner. Fingers 226 connected to the first busbar 222 extend towards the second busbar 224 but do not connect to the second busbar 224 so that there is a small gap between the ends of these fingers 226 and the second busbar 224. Likewise, fingers 226 connected to the second busbar 224 extend towards the first busbar 222 but do not connect to the first busbar 222 so that there is a small gap between the ends of these fingers 226 and the first busbar 222.

In the direction along the busbars 222 and 224, there is an overlap region including a central region where a portion of one finger overlaps with a portion of an adjacent finger (as illustrated by the central region 225). The central region 225 including the overlap may be referred to as the aperture, track, or active region where electric fields are produced between fingers 226 to cause an acoustic wave to propagate in the piezoelectric material 102. The periodicity of the fingers 226 is referred to as the pitch of the IDT. The pitch may be indicted in various ways. For example, in certain aspects, the pitch may correspond to a magnitude of a distance between fingers in the central region 225. The distance may be defined, for example, as the distance between center points of each of the fingers (and may be generally measured between a right (or left) edge of one finger and the right (or left) edge of an adjacent finger when the fingers have uniform thickness). In certain aspects, an average of distances between adjacent fingers may be used for the pitch. The frequency at which the piezoelectric material vibrates is a self-resonance (also called a "main-resonance") frequency of the electrode structure 204a. The frequency is determined at least in part by the pitch of the IDT 205 and other properties of the electroacoustic device 100.

The IDT 205 is arranged between two reflectors 228 which reflect the acoustic wave back towards the IDT 205 for the conversion of the acoustic wave into an electrical signal via the IDT 205 in the configuration shown and to prevent losses (e.g., confine and prevent escaping acoustic waves). Each reflector 228 has two busbars and a grating structure of conductive fingers that each connect to both busbars. The pitch of the reflector may be similar to or the same as the pitch of the IDT 205 to reflect acoustic waves in the resonant frequency range. But many configurations are possible.

When converted back to an electrical signal, the converted electrical signal may be provided as an output such as one of the first terminal 220 or the second terminal 230 while the other terminal may function as an input.

A variety of electrode structures are possible. FIG. 2A may generally illustrate a one-port configuration. Other 2-port configurations are also possible. For example, the electrode structure 204a may have an input IDT 205 where each terminal 220 and 230 functions as an input. In some such structures, an adjacent output IDT (not illustrated) that is positioned between the reflectors 228 and adjacent to the input IDT 205 may be provided to convert the acoustic wave propagating in the piezoelectric material 102 to an electrical signal to be provided at output terminals of the output IDT.

Figure 2B:
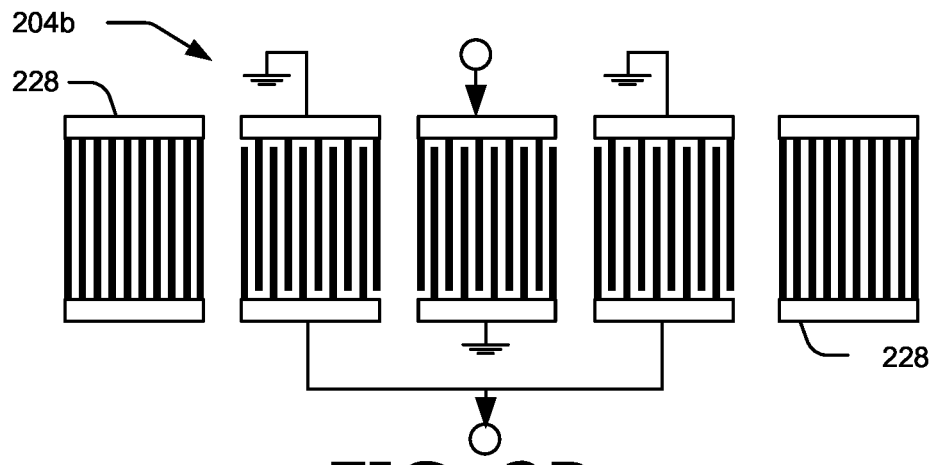
FIG. 2B is a diagram of a top view of another example of an electrode structure of an electroacoustic device for use with some examples described herein.

FIG. 2B is a diagram of a top view of another aspect of an electrode structure 204b of an electroacoustic device 100. In some cases, a dual-mode SAW (DMS) electrode structure 204b is illustrated that is a structure which may induce multiple resonances. The electrode structure 204b includes multiple IDTs along with reflectors 228 connected as illustrated. The electrode structure 204b is provided to illustrate the variety of electrode structures that principles described herein may be applied to including the electrode structures 204a and 204b of FIGS. 2A and 2B.

It should be appreciated that while a certain number of fingers 226 are illustrated, the number of actual fingers and lengths and width of the fingers 226 and busbars may be different in an actual implementation. Such parameters depend on the particular application and desired frequency of the filter. In addition, a SAW filter may include multiple interconnected electrode structures each including multiple IDTs to achieve a desired passband (e.g., multiple interconnected resonators or IDTs to form a desired filter transfer function).

Figure 3A:
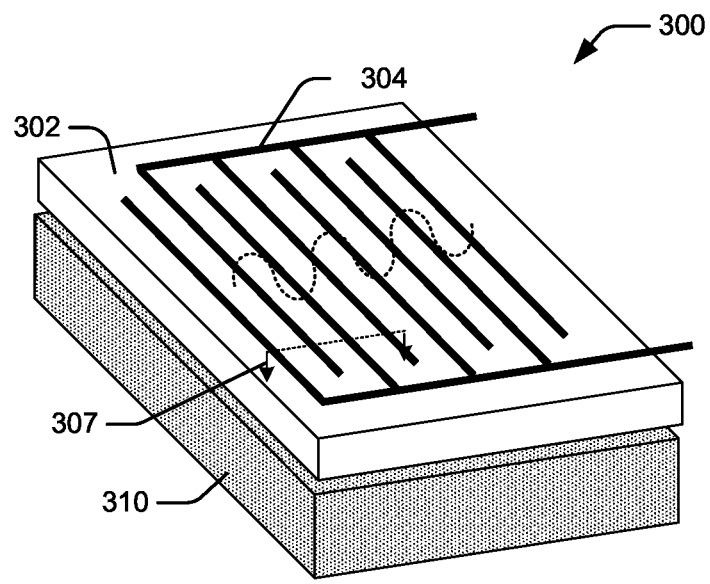
FIG. 3A is a diagram of a perspective view of another example of an electroacoustic device for use with some examples described herein.

FIG. 3A is a diagram of a perspective view of another aspect of an electroacoustic device 300. The electroacoustic device 300 (e.g., that may be configured as or be a part of a SAW resonator) is similar to the electroacoustic device 100 of FIG. 1A but has a different layer stack. In particular, the electroacoustic device 300 includes a thin piezoelectric material 302 that is provided on a substrate 310 (e.g., silicon). The electroacoustic device 300 may be referred to as a thin-film SAW resonator (TF-SAW) in some cases. Based on the type of piezoelectric material 302 used (e.g., typically having higher coupling factors relative to the electroacoustic device 100 of FIG. 1A) and a controlled thickness of the piezoelectric material 302, the particular acoustic wave modes excited may be slightly different than those in the electroacoustic device 100 of FIG. 1A. Based on the design (thicknesses of the layers, and selection of materials, etc.), the electroacoustic device 300 may have a higher Q-factor as compared to the electroacoustic device 100 of FIG. 1A. The piezoelectric material 302, for example, may be Lithium tantalate (LiTaO3) or some doped variant. Another example of a piezoelectric material 302 for FIG. 3A may be Lithium niobite (LiNbO3). In general, the substrate 310 may be substantially thicker than the piezoelectric material 302 (e.g., potentially on the order of 50 to 100 times thicker as one example—or more). The substrate 310 may include other layers (or other layers may be included between the substrate 310 and the piezoelectric material 302).

Figure 3B:
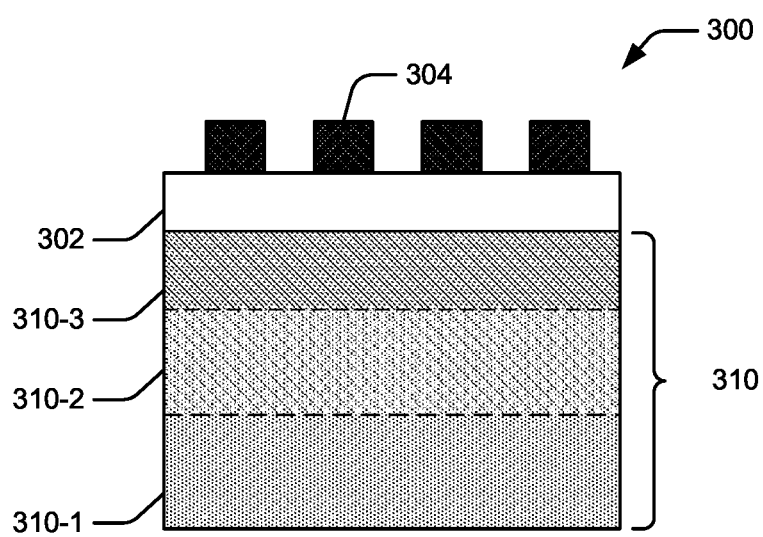
FIG. 3B is a diagram of a side view of the electroacoustic device of FIG. 3A.

FIG. 3B is a diagram of a side view of the electroacoustic device 300 of FIG. 3A showing an exemplary layer stack (along a cross-section 307). In the aspect shown in FIG. 3B, the substrate 310 may include sublayers such as a substrate sublayer 310-1 (e.g., of silicon) that may have a higher resistance (e.g., relative to the other layers—high resistivity layer). The substrate 310 may further include a trap rich layer 310-2 (e.g., poly-silicon). The substrate 310 may further include a compensation layer (e.g., silicon dioxide (SiO2) or another dielectric material) that may provide temperature compensation and other properties. These sublayers may be considered part of the substrate 310 or their own separate layers. A relatively thin piezoelectric material 302 is provided on the substrate 310 with a particular thickness for providing a particular acoustic wave mode (e.g., as compared to the electroacoustic device 100 of FIG. 1A where the thickness of the piezoelectric material 102 may not be a significant design parameter beyond a certain thickness and may be generally thicker as compared to the piezoelectric material 302 of the electroacoustic device 300 of FIGS. 3A and 3B). The electrode structure 304 is positioned above the piezoelectric material 302. In addition, in some aspects, there may be one or more layers (not shown) possible above the electrode structure 304 (e.g., such as a thin passivation layer).

Based on the type of piezoelectric material, the thickness, and the overall layer stack, the coupling to the electrode structure 304 and acoustic velocities within the piezoelectric material in different regions of the electrode structure 304 may differ between different types of electroacoustic devices such as between the electroacoustic device 100 of FIG. 1A and the electroacoustic device 300 of FIGS. 3A and 3B.

Figure 4:
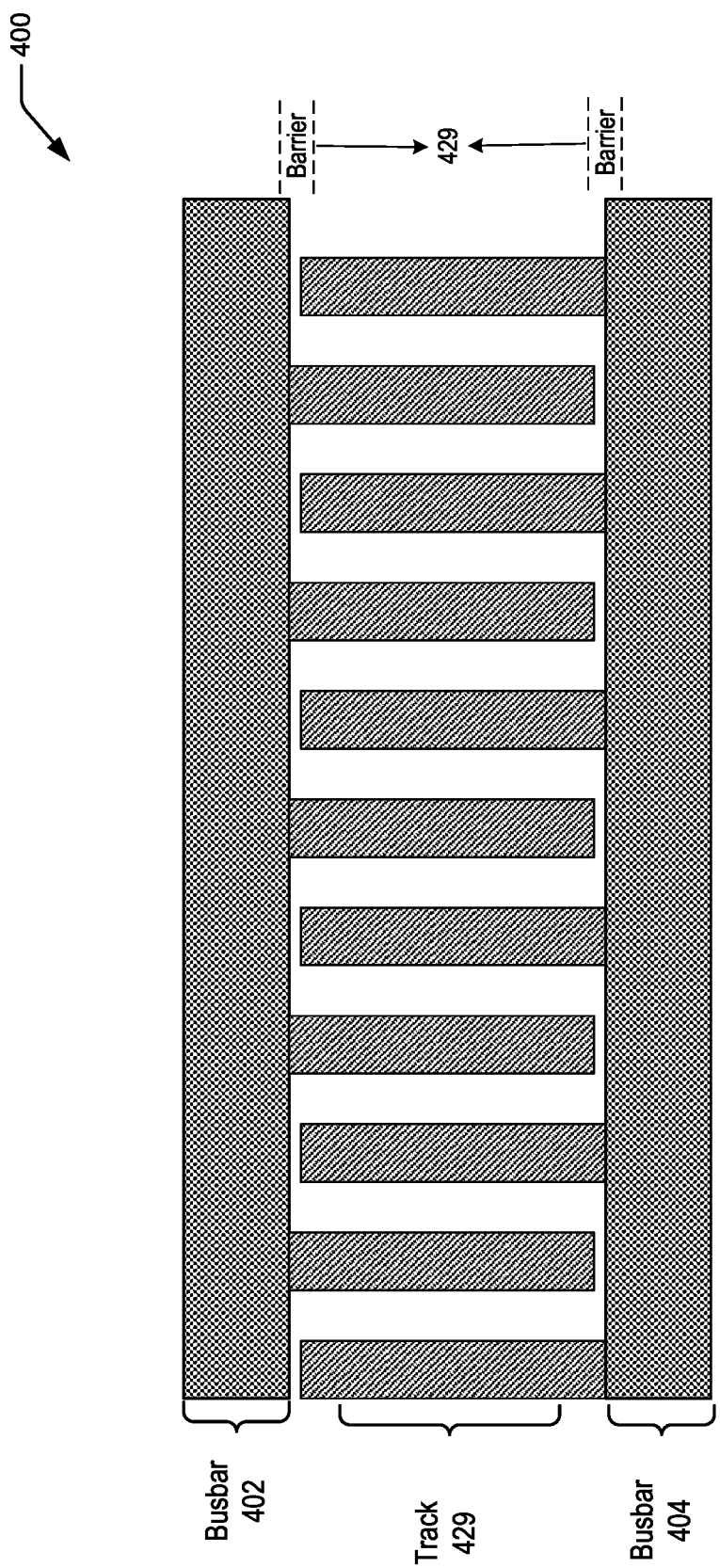
FIG. 4 is a diagram of a view of an electroacoustic device that can be used in accordance with examples described herein.

FIG. 4 is a diagram of a view of an electrode structure 400 of a resonator in accordance with some aspects. Just as above, the electrode structure 400 may be referred to as an IDT that can be fabricated on the surface of a piezoelectric material as part of the resonator. The electrode structure 400 includes first and second comb shaped electrodes. The comb teeth are within track 429, and supported by busbar 402 on one side and busbar 404 on the other side. An electrical signal excited on one side of the electrode structure is transformed into an acoustic wave that propagates in a particular direction via the piezoelectric material that electrode structure 400 is fabricated on. The acoustic wave is transformed back into an electrical signal and provided as an output.

Figure 5A:
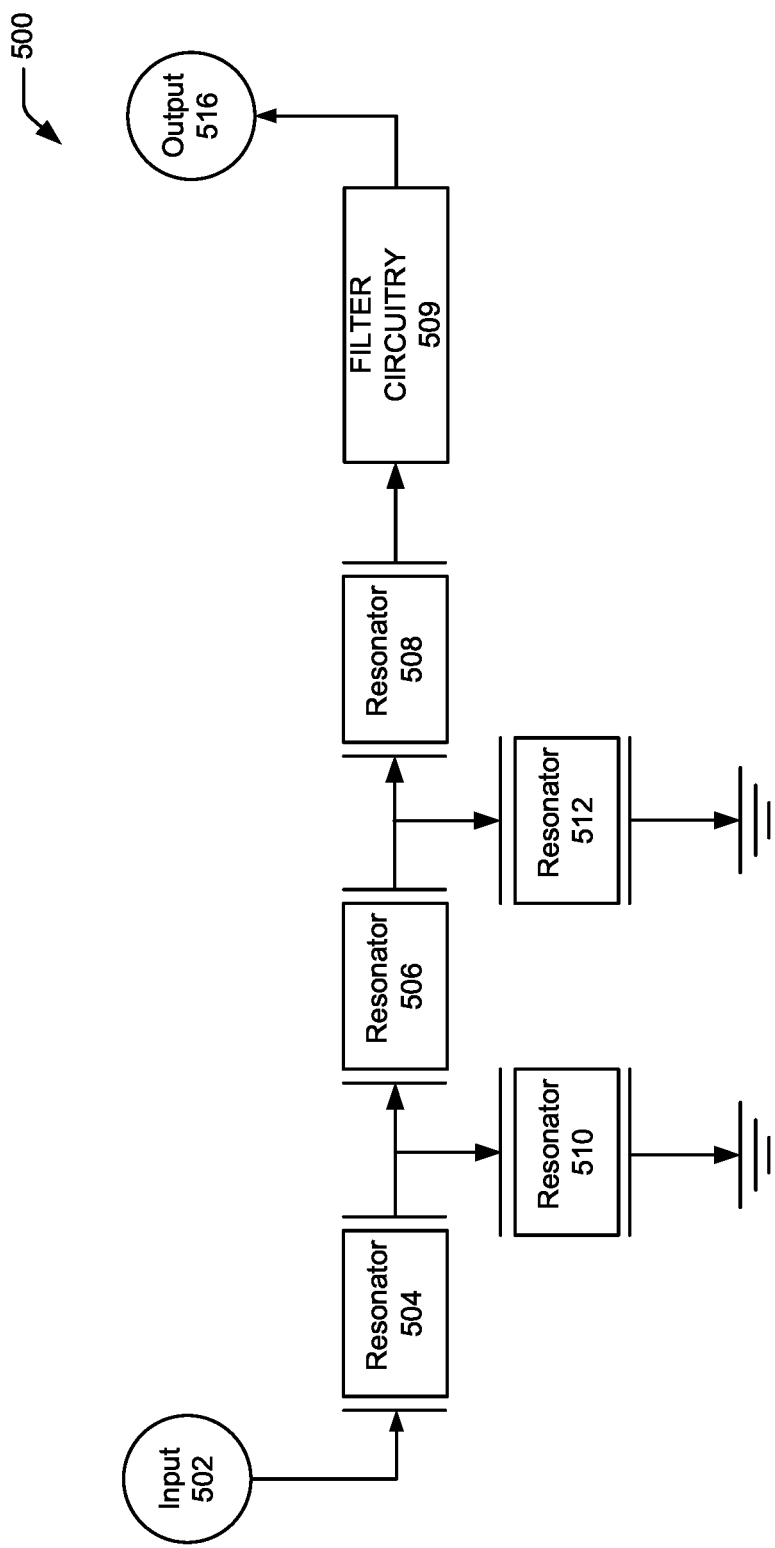
FIG. 5A is a schematic representation of aspects of a filter in accordance with examples described herein.
Figure 5B:
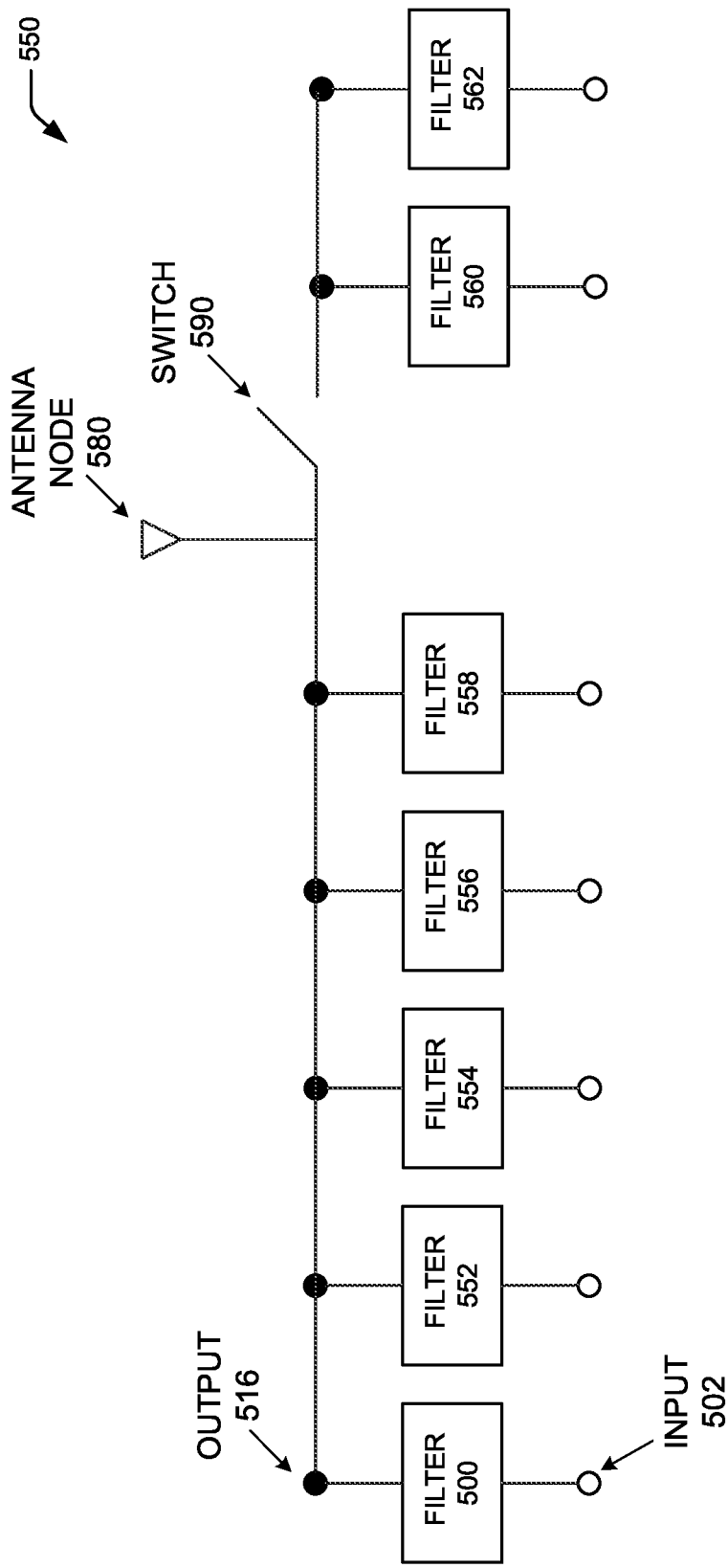
FIG. 5B is a schematic representation of a multiplexer with multiple filters configured for multi-band communications that can be used in accordance with examples described herein.
Figure 6:
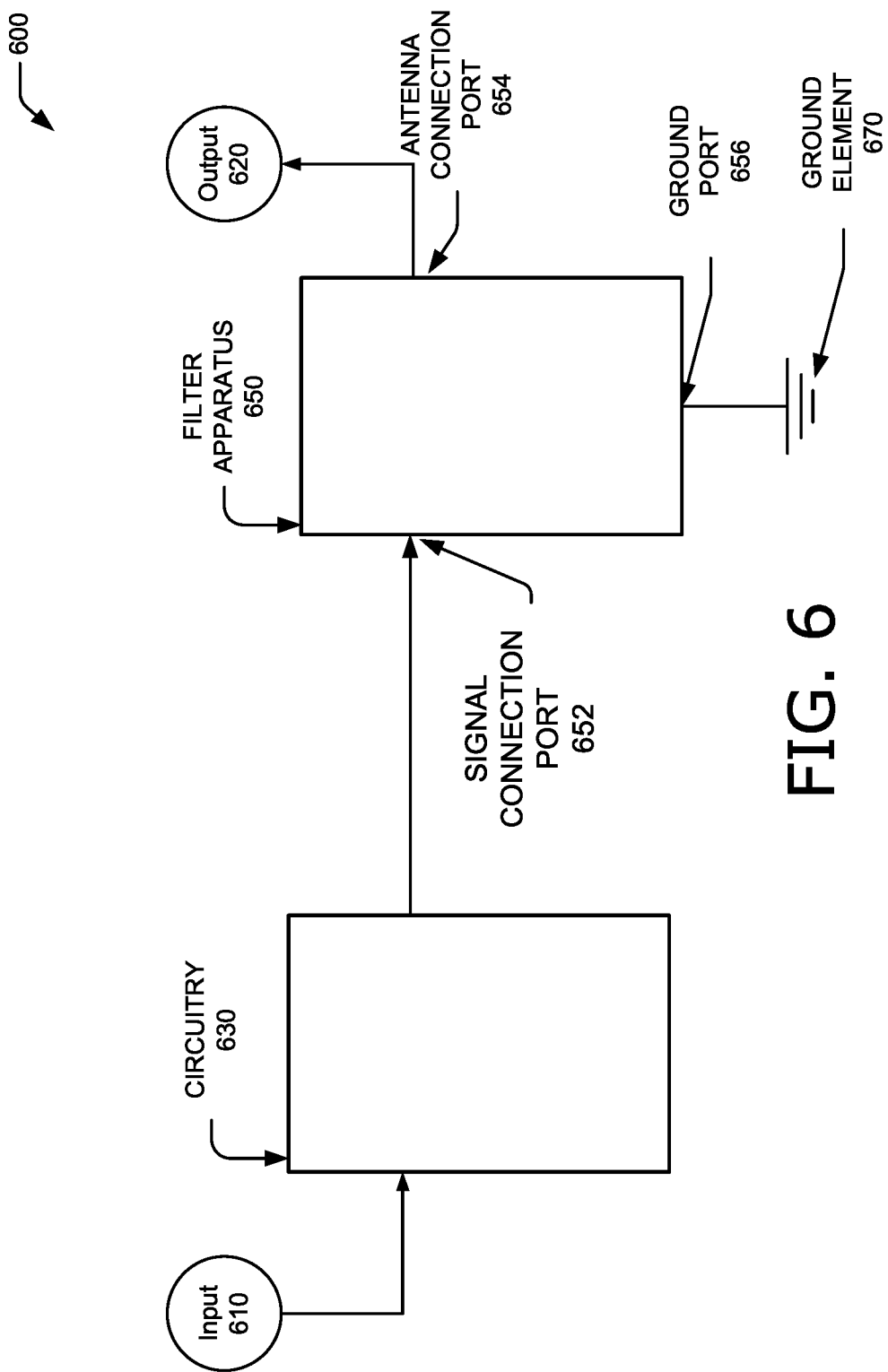
FIG. 6 is a schematic representation of aspects of a filter in accordance with examples described herein.
Figure 7:
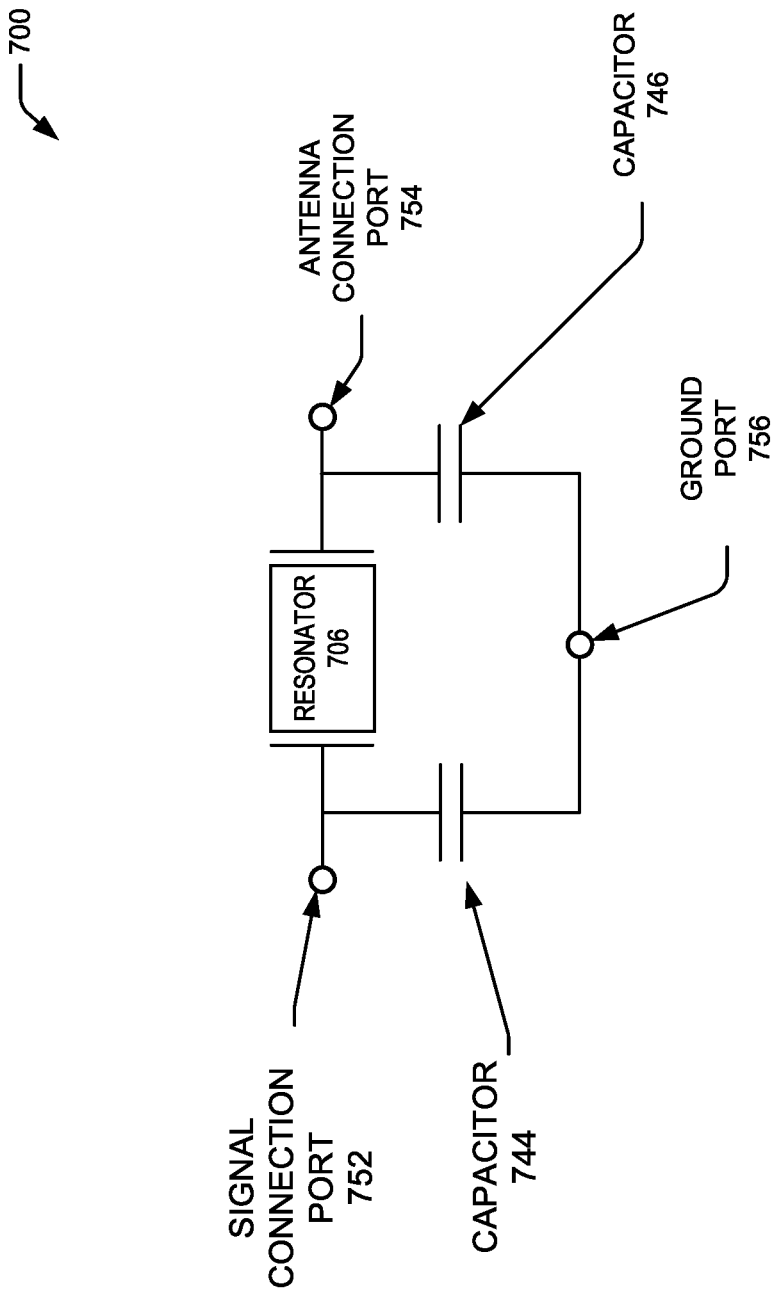
FIG. 7 is a schematic representation of aspects of a filter in accordance with examples described herein.

FIG. 5A is a schematic diagram of an electroacoustic filter circuit 500 that may have added filter circuitry 509 (e.g., a low phase delay apparatus) in accordance with the aspects described herein. The aspect of FIG. 5A includes a ladder structure. In other aspects, other structures can be used. Such a filter circuit 500 can be used for one band of a multi-band system that shares a single antenna, as illustrated by FIG. 5B and described herein. FIG. 5A is an illustration of a ladder circuit that can be used in one filter of a multiplexed multi-band system, with other bands using different filters. In accordance with aspects described herein, the low phase delay wireless apparatus (e.g., as illustrated in FIG. 6, FIG. 7, etc.) can be used in one or all filters for different frequency bands in a multi-band device. Some filters in a device can thus use a ladder structure illustrated by FIG. 5A without a low phase delay apparatus, while one or more other filters in the device include a low phase delay apparatus in accordance with aspects described herein.

In some aspects of the filter circuit 500, the ladder of resonators 504, 506, 508, 510, and 512 can be used with a low phase delay apparatus implemented as filter circuitry 509. In other aspects, a low phase delay apparatus can be implemented with matching circuitry and without additional filtering elements, as shown below in FIG. 7, FIG. 8, and FIGS. 9A and 9B. As described above, the low phase delay apparatus (e.g., implemented as the filter circuitry 509) may be used to improve filter performance in a multi-band environment by reducing interactions between bands while limiting space usage (e.g., with an improved parameter or coefficient for reflection at an output 516, as opposed to the transmission parameters from an input 502 to the output 516 and the output 516 to the input 502, or the reflection coefficient at the input 502).

As shown in FIG. 5A, the filter circuit 500 includes an input 502 and an output 516. Between the input 502 and the output 516, a ladder network of the resonators 504, 506, 508, 510, and 512 is provided. The resonators can be SAW or BAW resonators or any other such resonator device as detailed herein. The filter circuit 500 includes a first resonator 504, a second resonator 506, and a third resonator 508 all electrically connected in series between the input 502 and the output 516. A fourth resonator 510 (e.g., a shunt resonator) has a first terminal connected between the first resonator 504 and the second resonator 506, and a second terminal connected to a ground potential. A fifth resonator 512 (e.g., a shunt resonator) has a first terminal connected between the second resonator 506 and the third resonator 508 and a second terminal connected to a ground potential. The electroacoustic filter circuit 500 with the filtering from the above laddered resonators may, for example, be a band pass circuit having a passband within a selected frequency range.

Figure 9A:
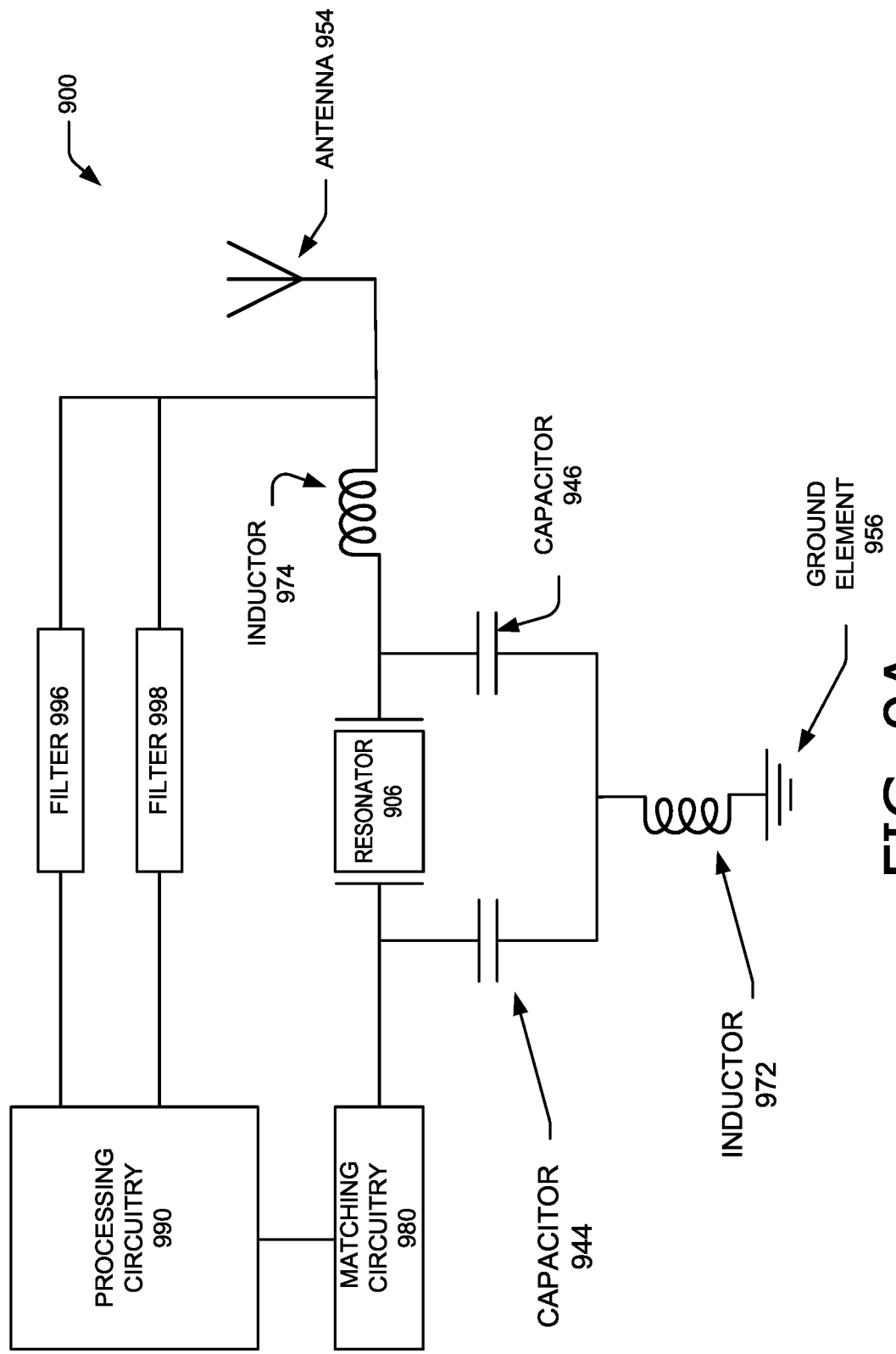
FIG. 9A is a schematic representation of aspects of a filter and an associated multiplexer (e.g., a triplexer) in accordance with examples described herein.

FIG. 5B is a schematic representation of a multiplexer circuit 550 with multiple filters configured for multi-band communications using antenna node 580. The filters include filter circuit 500 from FIG. 5A, including output 516 and input 502. Additional filters 552, 554, 556, 558, 560, and 562 are shown, which can be used for corresponding bands of the multi-band communications system. In other aspects, multiplexing with any number of filters can be used. FIG. 9A below, for example, describes a triplexer with a low phase delay filtering apparatus. The switch 590 can isolate the filters 560 and 562 from the remaining filters when the frequency bands associated when the filters 560 and 562 are not in use. Isolating the filters 560 and 562 can improve the communication performance of the multiplexer circuit 550 by limiting interference by the filters 560 and 562 with signals from the filters (or filter circuits) 500-558 when the filters 560 and 562 are not in use (e.g., signal loss due to leakage into the filters 560 and 562 is limited when the filters 560 and 562 are disconnected by the switch). In some aspects, additional switches can be included. The additional switches can create additional groupings of filters that can be isolated by the switches. In some aspects, no switches are used, in which case all of the filters can be hard-wired at an antenna node as part of the multiplexer circuitry.

Since the introduction of carrier aggregation in the standard setting for wireless communications by the Third Generation Partnership Project (3GPP) Release 10, the number of possible band combinations has increased significantly. For inter-band non-contiguous carrier aggregation, RF front-end solutions face significant challenges because many band select filters, which can be realized as microelectroacoustic filters in surface acoustic wave or bulk acoustic wave technology, are electrically combined at a common antenna node using a multiplexer such as the multiplexer circuit 550 illustrated in FIG. 5B. Such electrical combinations can be switchable in front-end architectures, to be able to choose between different band combinations. As additional bands are added in subsequent releases, the combinations of bands become more complex with more stringent operation thresholds.

In multiplexing (e.g., the combination of different frequency band filters on a common antenna node), the antenna impedance of one multiplexed filter will ideally show an open-circuit (e.g., for magnitude |F| and phase p of the reflection coefficient F at the antenna node) for the frequency range of the respective counter bands. For the aspect above, a first multiplexed filter for a first band will ideally show an open-circuit at the antenna node in a second band for a second filter multiplexed to the first filter. The best performance of a multiplexer (in terms of losses and the ability to switch between different operating states without performance degradation) would be achieved if the open-circuit condition (e.g., |F|=1, p=0 degrees) is perfectly fulfilled for all counter band frequencies. These ideal circumstances are typically not possible over a band frequency range in actual physical implementations of the different filters. For instance, real world physical systems are typically subject to losses and are dispersive. The magnitude of the reflection coefficient of a real filter is typically less than one. Additionally, the phase angle of the reflection coefficient is frequency-dependent, such that a phase spread is observed over a frequency range.

As a part of the phase spread over a band frequency range, the more the perfect open-circuit condition is violated (e.g., the further the magnitude is from 1 and the further the phase angle is from 0 degrees), the more power leaks between multiplexed filters via the antenna node. The power leakage results in increased losses for the filters in the multiplexer configuration (e.g., the multiplexer circuit 550). These multiplexing losses significantly increase the more the phase angle of the reflection coefficient deviates from zero degrees. When several frequency bands are combined in a multiplexer, the perfect open-circuit condition in terms of phase angle can only be fulfilled for a single frequency point. Consequently, additional losses are introduced for frequencies below and above that frequency point.

Aspects of filter circuits are described herein, where the phase characteristics of the filter circuits are modified to reduce the losses described above. The reduction of these multiplexing losses allows improved device performance. For some communication standards, the reduction of the multiplexing losses allows a device to meet standards based performance metrics using limited physical resources and physical space. RF front-end modules for devices that include filter circuits in accordance with the aspects described herein can thus provide improved communication performance. With respect to aspects described herein, some or all of the filters in a multiplexer circuit (e.g., the multiplexer circuit 550) can use a low phase delay apparatus (e.g., apparatus 700 of FIG. 7) to improve device performance. Additional details of such low phase delay structures and the associated operation of an apparatus including such structures are described below.

FIG. 6 is a schematic representation of aspects of a filter circuit 600 in accordance with aspects described herein. The filter circuit 600 can be used as any filter of the multiplexer circuit 550. The filter circuit 600 includes an input 610 (e.g., on an input, processing circuitry, or device side of circuit 600) that can be coupled to processing circuitry and an output 620 (e.g., on an output or antenna side) that can be connected to an antenna (e.g., the antenna node 580) via a multiplexing node coupled to multiple filters. The example of the filter circuit 600 in FIG. 6 is one aspect of a filter that can use a low phase delay filter apparatus 650 in accordance with aspects described herein.

The low phase delay filter apparatus 650 includes a signal connection port 652 that is coupled to the input 610 via the circuitry 630. The circuitry 630 can include matching circuitry, which can be optional in some implementations. The circuitry 630 can also include additional filtering elements such as the ladder of resonators shown in FIG. 5A. Some aspects of circuitry can include multiple low phase delay filter apparatuses (e.g., apparatus 700) serially connected in the signal path. In other aspects, devices can use other such combinations of one or more low phase delay wireless communication apparatuses.

The filter apparatus 650 includes connection ports, including an output port 654 (e.g., an antenna connection port or other such port on a side connected to or towards an antenna or antenna port) coupled to output 620, and a ground port 656 coupled to a ground element 670. Specific details of operations of an example filter apparatus such as filter apparatus 650 are shown in filter response 1000 of FIG. 10, and additional specific aspects are discussed below.

FIG. 7 is a schematic representation of aspects of a wireless communication apparatus 700 in accordance with aspects described herein. The wireless communication apparatus 700 can be one implementation of the low phase delay apparatus 650 of FIG. 6. Wireless communication apparatus 700 includes an acoustic resonator 706, a signal connection port 752, a first capacitor 744, a ground port 756, a second capacitor 746, and an output port 754. The acoustic resonator 706 has a first resonator side and a second resonator side. The signal connection port 752 is coupled to the first resonator side. The first capacitor 744 includes a first side coupled to the first resonator side of the acoustic resonator 706 and the signal connection port 752. The first capacitor 744 further includes a second side. The ground connection port 756 is coupled to the second side of the first capacitor 744. The second capacitor 746 includes a first side coupled to the ground connection port 756, and a second side. The output port 754 is coupled to the second resonator side of the resonator 706 and the second side of the second capacitor 746. In some aspects, the apparatus 700 can be implemented on an acoustic die. Such an acoustic die can, for example, use a lithium niobate or lithium tantalate substrate which is mounted as part of a larger device, with the various ports on the acoustic die connected to elements of the larger device (e.g., such as the devices described in FIG. 9A, FIG. 12, FIG. 13, etc.). In other cases, the capacitors (e.g., the first capacitor 744 and the second capacitor 746) are implemented outside of the acoustic die that the acoustic resonator is on.

Wireless communication apparatus 700 as illustrated by FIG. 7 provides a filter with a left skirt that is defined by characteristics of the acoustic resonator 706. A right skirt provided by wireless communication apparatus 700 is defined by values of the capacitors 744 and 746 combined with inductance values between the ground port 756 and a ground element. The acoustic resonator 706 includes capacitive characteristics that are used as part of the low phase delay configuration. In some implementations with large capacitive values for acoustic resonator 706 (e.g., inherent capacitance of the resonator separate from the capacitors 744 and 746), wireless communication apparatus 700 can provide lower frequency passbands for signals. The acoustic resonance properties have a lower impact on performance, resulting in a steeper left skirt (e.g., at lower frequencies) and a less steep right skirt (e.g., at higher frequencies). The large capacitive values for the acoustic resonator 706 can therefore be used for lower frequency bands at the expense of higher frequency bands. In some aspects, for a performance tradeoff set to balance the left skirt performance and right skirt performance, the capacitance of the acoustic resonator 706 is selected at a value between 0.3 picofarads (pF) and 2 pF. In some aspects, the value can be within a threshold tolerance (e.g., five percent (5%)) of the selected value in the described range. In other aspects, other values can be used to accommodate specific combinations of frequency bands.

In some aspects, the wireless communication apparatus 700 can be considered as a two branch structure, with the resonator 706 configured to achieve a steep transition at lower frequencies, and the two capacitors 744 and 746 used to provide design freedom to center a low phase condition based on performance thresholds associated with a communication system (e.g., 3GPP standards compliant communication systems). Additional details and implementation aspects are described below, particularly with respect to the frequency response chart of FIG. 10 that illustrates an aspect of the left and right skirts of a filter associated with a wireless communication apparatus such as wireless communication apparatus 700.

Figure 8:
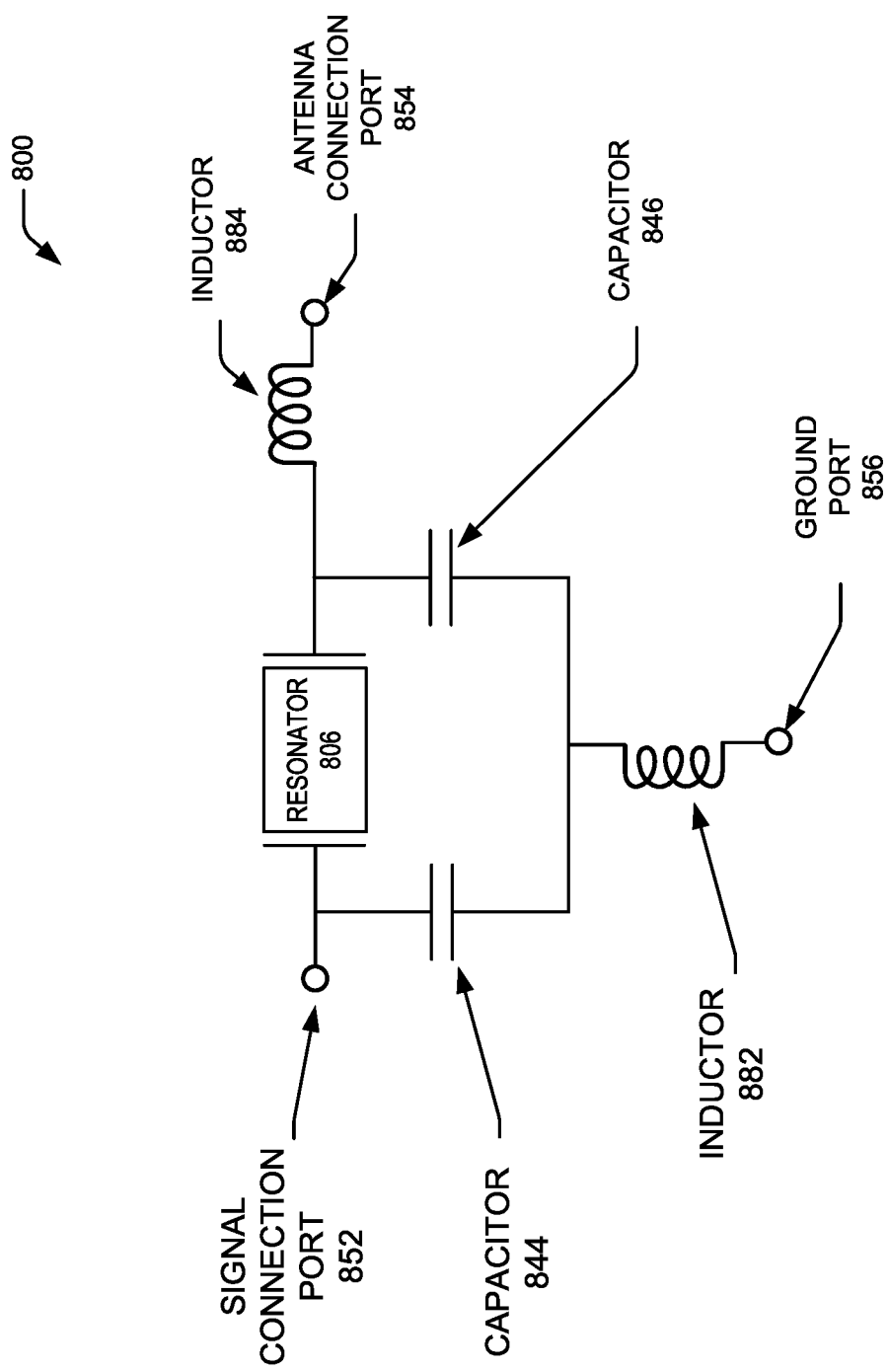
FIG. 8 is a schematic representation of aspects of a filter in accordance with examples described herein.

FIG. 8 is a schematic representation of aspects of a wireless communication apparatus 800 in accordance with aspects described herein. The frequency response of a filter for such a wireless communication apparatus is set not only by the performance values of the two capacitors and the acoustic resonator, but also by the values of elements connected to the ports, particularly inductance values for the antenna connection port (e.g., output port 754) and ground port (e.g., ground port 756). In some aspects, inductors can be integrated with the connections used to couple the various ports to a larger device (e.g., using a laminate coil). For example, ground port 756 can be a connection terminal in an acoustic die, and an inductor element can be part of the physical structure electrically connecting the connection terminal in the acoustic die to a terminal on a device (e.g., electronic device 1302) that the acoustic die is mounted to. A similar inductor element can be part of a connection from any port of such an acoustic die to a device that the acoustic die is mounted to. In other aspects, such inductor elements or parts of such inductor elements can be integrated on an acoustic die as shown in wireless communication apparatus 800 of FIG. 8.

Wireless communication apparatus 800 includes an acoustic resonator 806, a signal connection port 852, a capacitor 844, and a capacitor 846, connected just as shown in FIG. 7 for the corresponding two capacitors (e.g., the capacitors 744 and 746) and resonator (e.g., the resonator 706). The wireless communication apparatus 800 additionally includes inductor 884 coupled between the output port 854 and the second resonator side of resonator 806, as well as the inductor 882 coupled between the ground port 856 and the two capacitors 844 and 846.

The inductor 882 operates with the capacitors 844 and 846 to create the high frequency skirt of the filter for wireless communication apparatus 800 (e.g., described above and illustrated in FIG. 10). The high frequency skirt branch creates the needed rejection and phase conditions for high frequency bands with limited space usage in a device design. The high frequency skirt branch rejection and phase conditions are configured considering overall device conditions and characteristics in conjunction with the acoustic resonator 806. In some aspects operating with the capacitive properties of a resonator 806 set at or between 0.3 pF and 2 pF as described above, the following range of values is used to create a low phase delay filter that can be used to multiplex multiple frequency bands: for the capacitors 844 and 846, a range of values is selected at or between 0.1 pF and 0.7 pF (e.g., for either or both); and for the inductor 882, the inductance value is selected at or between a range of values from 0.5 nanohenries (nH) to 3 nH. In other aspects, other ranges can be used matched to particular frequency band operations.

The inductor 884 can be used to define a high frequency rejection and to tune a high band open phase condition to a preferred frequency range, depending on the particular supported bands. In some aspects, a range of between 1 and 5 nH can be used in conjunction with the values described for the resonator 806, the capacitors 844 and 846, and the inductor 882 above to select filter characteristics for frequencies between 3 and 6 GHz. In various aspects, the frequency ranges above can be described for component elements or structures that are within a threshold tolerance of a selected value in the range (e.g., within 5%, 10%, etc.). In other aspects, other component characteristic values can be selected and targeted to the specific frequency bands used for a particular multi-band application.

FIG. 9A is a schematic representation of aspects of a filter and an associated multiplexer (e.g., a triplexer) in accordance with aspects described herein. FIG. 9A illustrates elements of a wireless device 900 that include elements of the apparatus of FIG. 8. In addition to the filter elements described in FIG. 8, wireless device 900 is shown including antenna 954, ground element 956, matching circuitry 980, processing circuitry 990, filter 996, and filter 998. In some aspects, the matching circuitry 980 can be used to manage an output impedance for the connection to processing circuitry 990. In some aspects, processing circuitry can include a transceiver, one or more power amplifiers, one or more low noise amplifiers, a mixer, or other elements of a transceiver chain. In other examples, matching circuitry 980 is not used, and the direct match between processing circuitry 990 and the filter elements provides sufficient performance.

A resonator 906, a capacitor 944, a capacitor 946, an inductor 972, and an inductor 974 are coupled as described above for FIG. 8. Rather than showing ports, device 900 includes the inductor 974 coupled to the antenna 954 along with filters 996 and 998. Such filter elements can be configured on an acoustic die as described above, or integrated in the device 900 in any acceptable configuration. The filters 996 and 998, and the signal path from matching circuitry 980 through inductor 974, each operate as filters for different frequency bands as described above. The illustrated antenna 954 can transmit and/or receive signals on three frequency bands, with one band for each path between the antenna 954 and the processing circuitry 990. The three paths are part of circuitry to effectively form a triplexer that couples signals to the antenna 954. In some aspects, the filters 996 and 998 can be alternate filter structures without the described low phase delay structure. The filters 996 and 998 can, for example, be the ladder structure illustrated in FIG. 5A, or any other such structure. In other aspects, the filters 996 and 998 can be implementations of the filter for wireless communication apparatus 800, with component values selected for the particular associated frequency bands.

As described above, real-world filters for the different frequency bands may not able to completely isolate the different bands from each other, due to various device limitations that cannot achieve perfect or ideal conditions over a frequency range. Signals from the different bands (e.g., via filters 996 and 998) can interact through the triplexer connection to antenna 954 shown in device 900. The apparatus structure with resonator 906 and capacitors 944 and 946, along with inductors 974 and 972 with matching circuitry 980 operate as a compact filter with low phase delay centered by capacitors 944 and 946. The structure can be used to efficiently structure a filter for LTE and 5G triplexer for certain frequency ranges. To maintain performance, certain thresholds are used, including dispersion characteristics for filters at each frequency band. As additional bands are added to existing multi-band systems, current filters and multiplexers may not meet performance thresholds. In particular, certain LTE band diplexers use filters that do not meet thresholds when a third frequency band is added and the diplexer changed to a triplexer to couple a new band to a shared antenna. Aspects described herein can include devices and apparatuses with a filter for improved device operation over LTE and 5G frequency bands, where phase delay can be configured to a lower value with an associated reduction of out of band dispersion and with improved communication performance.

In one aspect the device 900 is structured with the acoustic resonator 906, the first capacitor 944, the second capacitor 946, the first inductor 972, and the second inductor 974 as a first filter with a passband within a threshold tolerance of in a range between 1 gigahertz (GHz) and 2.69 GHz. In some such aspects, the first filter including acoustic resonator 906 has an out-of-band frequency range from 3.3 gigahertz (GHz) to 5 GHz with a reflection parameter for the out-of-band frequency range being within a threshold tolerance of an open condition. In other aspects, other ranges can be used, or a range approximately or within a threshold tolerance of 3.3 GHz to 5 GHz can be used. In some such aspects, the first filter has an out-of-band frequency range (e.g., from 3.3 gigahertz (GHz) to 5 GHz) with a transmission parameter for the out-of-band frequency range being less than −15 decibels (dB). In other aspects, other such bands, thresholds, and parameters can be used.

In some aspects, the filter 996 has a second filter passband range from 3.3 gigahertz (GHz) to 4.2 GHz, and the filter 998 has a third filter passband range from 4.4 GHz to 5.0 GHz. In other aspects, other numbers of filters can be present, or other frequency ranges, characteristics, and threshold tolerances can be used. Similarly, as described above, some aspects can use the described wireless communication apparatus structure repeatedly (e.g., multiple copies in series), or the structure can use multiple resonators (e.g., multiple resonators in place of resonator 906 to achieve particular performance characteristics). Such aspects can be structured to achieve particular filter performance while limiting phase delay and balancing performance and space utilization in accordance with the aspects described herein.

Figure 9B:
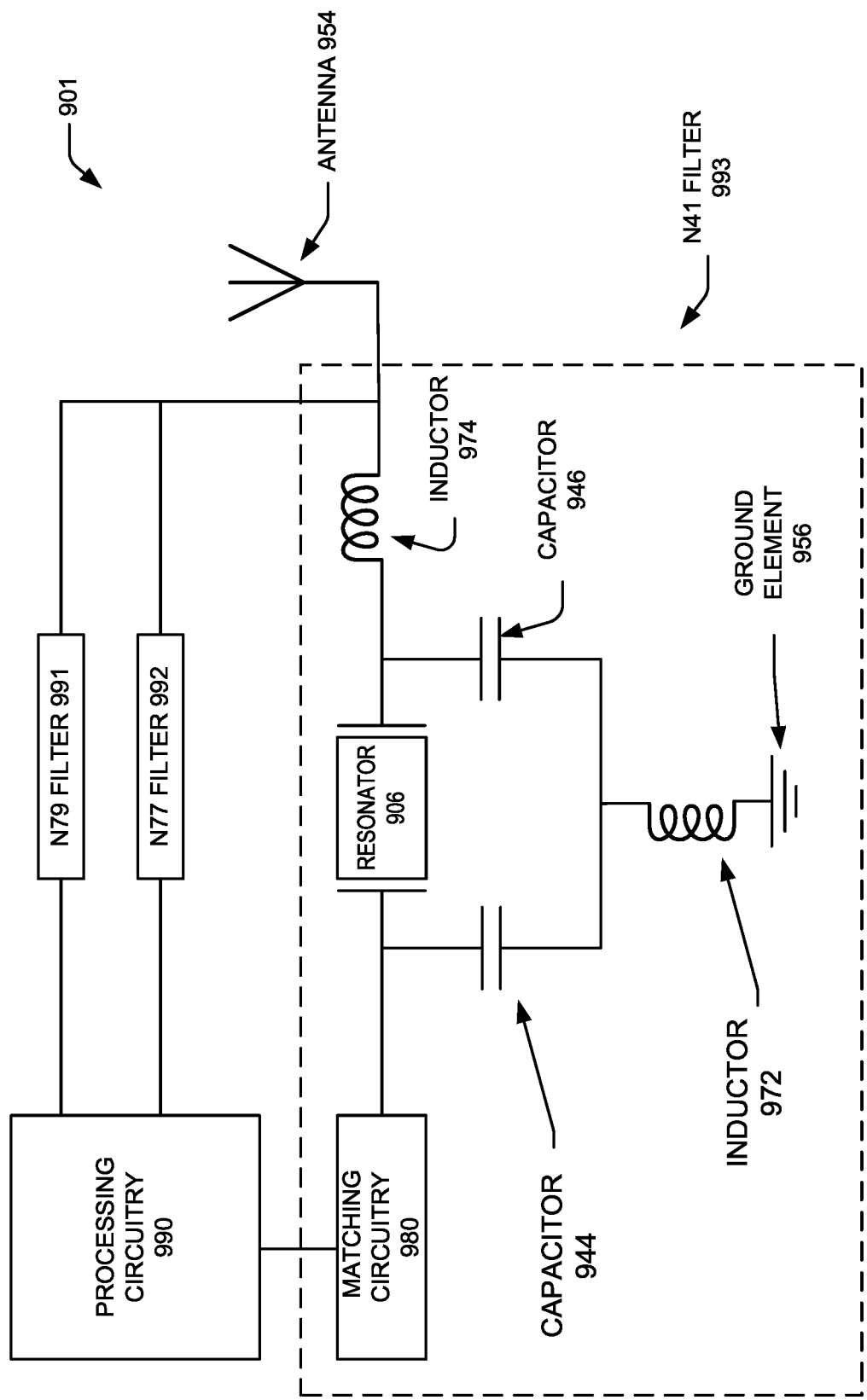
FIG. 9B is a schematic representation of aspects of a triplexer including N79, N77, and N41 filters in accordance with examples described herein.

FIG. 9B is a schematic representation of aspects of a triplexer 901 including specific illustrated filters in accordance with examples described herein. The triplexer 901 of FIG. 9B can be viewed as an implementation of the device 900, where the filter 996 is implemented as an N79 filter 991, the filter 998 is implemented as an N77 filter 992, and the remaining elements (e.g., including the matching circuitry 980, the resonator 906, the inductor 974, the capacitors 944 and 946, the inductor 972, and the ground element 956) implement an N41 filter 993 as shown. In the example of FIG. 9B, the N79 filter 991 and the N77 filter 993 can represent highband (HB) and ultrahighband (UHB) filters respectively. In some examples, these filters can be replaced by other such HB or UHB filters or additional such HB or UHB filters. In some such embodiments, the N41 filter 993 can represent a mid-highband (MHB) filter. In some embodiments, the N41 filter can be replaced by other such MHB passband filters for other bands, or can further include other such MHB filter or passband circuitry for other bands.

Aspects described herein include devices and wireless communication apparatuses that use a specific filter topology for low phase delay filters. While various implementations are described herein within the context of electroacoustic resonators, other such resonators with similar properties can be used for certain implementations. Aspects can thus include the described filter topology with electroacoustic resonators, other types of resonators, or combinations of electroacoustic resonators and other types of resonators.

Figure 10:
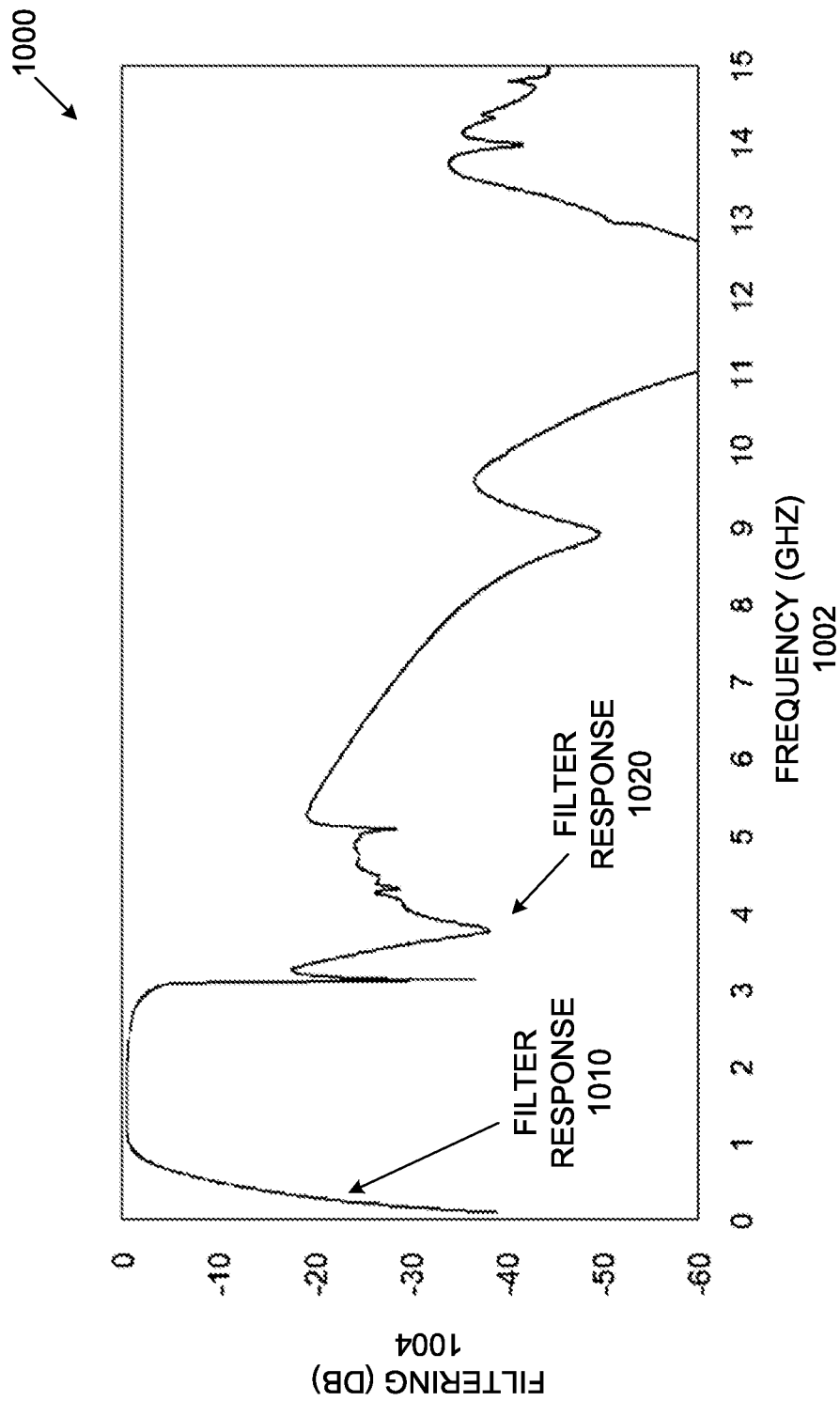
FIG. 10 is a graph illustrating a filter response for an example filter in accordance with examples described herein.

FIG. 10 is a graph illustrating a filter response 1000 for an example filter (e.g., associated with a wireless communication apparatus such as the wireless communication apparatus 700 or 800) in accordance with aspects described herein. As shown, filter response 1000 is presented in a graphs with filtering axis 1004 in decibels (dB) and frequency axis 1002 in gigahertz (GHz). The graphed filter response shows a left skirt filter response 1010 and a right skirt filter response 1020. The filter response 1000 is discussed in a context of the wireless communication apparatus 800, but can be related to any aspect described herein. As mentioned above, a capacitance value associated with the acoustic resonator 806 can be used to set a steepness of the left skirt filter response 1010. Higher capacitive values can increase the steepness of the left skirt filter response 1010, but can impact the right skirt filter response 1020, reducing steepness, and so values for a capacitance of the acoustic resonator 806 can be balanced to target performance characteristics for a particular multi-band system. In addition, certain acoustic resonators can be fabricated with high coupling characteristics. Such resonators can, for example, be BAW resonators with additional stacks (e.g., 4 stacks), or higher performance SAW resonators. In some aspects, a threshold coupling characteristic is selected (e.g., 15-20% coupling) for the acoustic resonator 806. In other aspects, the resonator 806 can be selected with lower coupling characteristics (e.g., 7-8% coupling). In some aspects, multiple resonators can be coupled to achieve higher coupling (e.g., replacing acoustic resonator 806 with multiple resonators to achieve higher coupling characteristics). Such higher coupling value can further be used to increase the slope of the skirts associated with the filter responses 1010 and 1020. In some aspects, additional space is a design trade-off for additional performance associated with improved performance configurations of the filter responses 1010 and 1020.

Additionally, the capacitors 844 and 846 can be used to manage the phase characteristics over the communication bands, and in conjunction with the inductor 884, can create the rejection for improved performance at filter response 1020 in addition to the improve low phase delay performance. The inductor 884 is then used to further tune the open phase condition and the shape of the filter response 1020 depending on the particular supported frequency band(s). The above filter response 1000 is associated with one particular configuration of a wireless communication apparatus with low phase delay. Additional configurations with selections of different element characteristics (e.g., different inductive and capacitive value selection) can result in different filter responses for a design configured to different multi-band operations.

Figure 11:
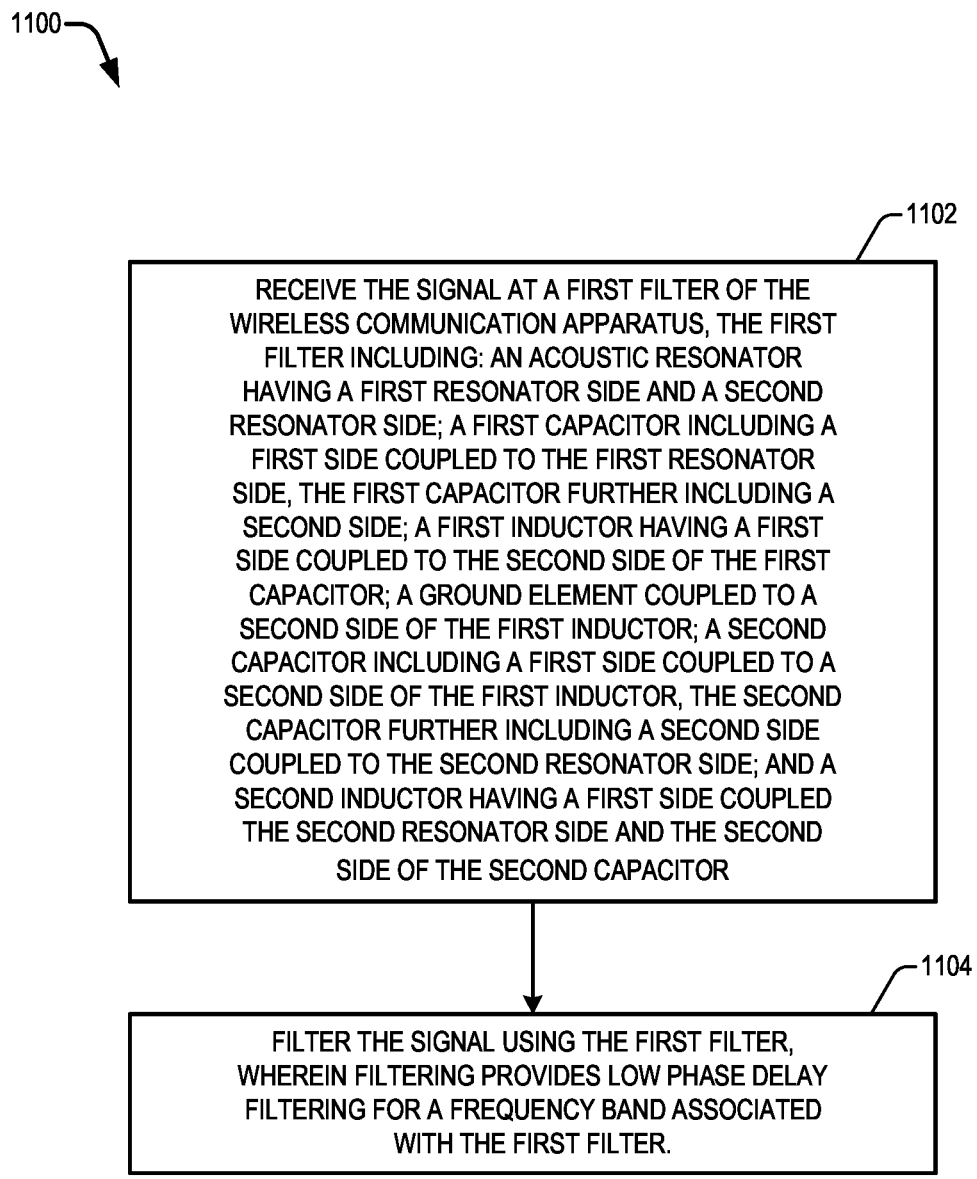
FIG. 11 is a flowchart illustrating a method in accordance with examples described herein.

FIG. 11 is a flow chart illustrating an example of a method 1100 for filtering a signal in a wireless communication apparatus for a multi-band system. The method 1100 is described in the form of a set of blocks that specify operations that can be performed. However, operations are not necessarily limited to the order shown in FIG. 11 or described herein, for the operations may be implemented in alternative orders or in fully or partially overlapping manners. Also, more, fewer, and/or different operations may be implemented to perform the method 1100, or an alternative approach.

At block 1102, the method 1100 includes operations to receive the signal at a first filter of the wireless communication apparatus, the first filter including: an acoustic resonator having a first resonator side and a second resonator side; a first capacitor including a first side coupled to the first resonator side, the first capacitor further including a second side; a first inductor having a first side coupled to the second side of the first capacitor; a ground element coupled to a second side of the first inductor; a second capacitor including a first side coupled to a second side of the first inductor, the second capacitor further including a second side coupled to the second resonator side; and a second inductor having a first side coupled the second resonator side and the second side of the second capacitor.

At block 1104, the method 1100 includes operations to filter the signal using the first filter, wherein filtering provides low phase delay filtering for a frequency band associated with the first filter.

If the filtered signal is received at an output port (e.g., from the antenna 954), the filtered signal can then be output to processing circuitry (e.g., processing circuitry 990) of the wireless communication apparatus. If the filter signal is received at an input port (e.g., from device or input side processing circuitry 990), the signal can be output to the antenna for wireless transmission. In accordance with descriptions provided herein, a wireless communication apparatus can include additional filters which perform additional filtering operations, as well as processing circuitry and other elements that perform additional operations, either as part of the processing of the signal, or as processing of other signals in the device. Such operations can be performed sequentially or in parallel with the operations of method 1100. Additionally, in some examples, the operations of method 1100 can include intervening or repeated operations in addition to the specific operations described above.

Additional illustrative aspects of the disclosure include:

Aspect 1. A wireless communication apparatus comprising: an acoustic resonator having a first resonator side and a second resonator side, the first resonator side coupled to a first signal connection port; a first capacitor including a first side coupled to the first resonator side and the first signal connection port, the first capacitor further including a second side coupled to a ground connection port; and a second capacitor including a first side coupled to the ground connection port, the second capacitor further including a second side, the second resonator side and the second side of the second capacitor coupled to an output port.

Aspect 2. The wireless communication apparatus of aspect 1, wherein the acoustic resonator, the first signal connection port, the first capacitor, the ground connection port, the second capacitor, and the output port are integrated in an acoustic die.

Aspect 3. The wireless communication apparatus of any of aspects 1-2, wherein the first capacitor has a first capacitance value within a threshold tolerance of a range from 0.1 picofarads (pF) to 0.7 pF, and wherein the second capacitor has a second capacitance value within the threshold tolerance of the range from 0.1 pF to 0.7 pF.

Aspect 4. The wireless communication apparatus of aspect 3, wherein the threshold tolerance is five percent.

Aspect 5. The wireless communication apparatus of any of aspects 2-3, further comprising: a first inductor coupled between the ground connection port and a ground element.

Aspect 6. The wireless communication apparatus of aspect 5, further comprising a second inductor coupled to the output port.

Aspect 7. The wireless communication apparatus of aspect 6, wherein the first inductor has an inductance value within a threshold tolerance between 0.5 nanohenries (nH) and 3 nH, and wherein the second inductor has an inductance value within a threshold tolerance between 1 nH and 5 nH.

Aspect 8. The wireless communication apparatus of any of aspects 6-7, wherein the first inductor is integrated in a laminate between the ground element and the acoustic die.

Aspect 9. The wireless communication apparatus of any of aspects 6-7, further comprising a first filter, the first filter including the acoustic resonator, the first capacitor, the second capacitor, the first inductor, and the second inductor, wherein an input side of the first filter is connected to the first resonator side, and wherein an antenna side of the first filter is connected to a second side of the second inductor.

Aspect 10. The wireless communication apparatus of aspect 9, wherein the first filter has a passband within a threshold tolerance of in a range between 1 gigahertz (GHz) and 2.69 GHz.

Aspect 11. The wireless communication apparatus of any of aspects 9-10, wherein the first filter has an out-of-band frequency range from 3.3 gigahertz (GHz) to 5 GHz with a reflection parameter for the out-of-band frequency range being within a threshold tolerance of an open condition.

Aspect 12. The wireless communication apparatus of any of aspects 9-11, wherein the first filter has an out-of-band frequency range from 3.3 gigahertz (GHz) to 5 GHz with a transmission parameter for the out-of-band frequency range being less than −15 decibels (dB).

Aspect 13. The wireless communication apparatus of any of aspects 9-12, further comprising: a second filter having a second filter antenna side connected to the antenna side of the first filter; and a third filter having a third filter antenna side connected to the antenna side of the first filter.

Aspect 14. The wireless communication apparatus of aspect 13, wherein the second filter has a second filter passband range from 3.3 gigahertz (GHz) to 4.2 GHz, and wherein the third filter has a third filter passband range from 4.4 GHz to 5.0 GHz.

Aspect 15. The wireless communication apparatus of any of aspects 1-14, wherein the acoustic resonator is a bulk acoustic wave resonator.

Aspect 16. The wireless communication apparatus any of aspects 1-14, wherein the acoustic resonator is a thin-film surface acoustic wave (SAW) resonator.

Aspect 17. The wireless communication apparatus of any of aspects 1-16, further comprising an antenna coupled to the output port.

Aspect 18. The wireless communication apparatus any of aspects 1-17, wherein the wireless communication apparatus is an electrical filter component integrated on an acoustic die.

Aspect 19. A wireless device comprising: an acoustic resonator having a first resonator side and a second resonator side; processing circuitry coupled to the first resonator side; a first capacitor including a first side coupled to the first resonator side and the processing circuitry, the first capacitor further including a second side; a first inductor having a first side coupled to the second side of the first capacitor; a ground element coupled to a second side of the first inductor; a second capacitor including a first side coupled to a second side of the first inductor, the second capacitor further including a second side coupled to the second resonator side; a second inductor having a first side coupled the second resonator side and the second side of the second capacitor.

Aspect 20. The wireless device of aspect 19, wherein the acoustic resonator, the first capacitor, and the second capacitor are integrated in an acoustic die.

Aspect 21. The wireless device of any of aspects 19-20, wherein the first capacitor has a first capacitance value within a threshold tolerance of a range from 0.1 picofarads (pF) to 0.7 pF, and wherein the second capacitor has a second capacitance value within the threshold tolerance from 0.1 pF to of 0.7 pF.

Aspect 22. The wireless device of aspect 21, wherein the threshold tolerance is five percent.

Aspect 23. The wireless device of any of aspects 20-22, wherein the first inductor has an inductance value within a threshold tolerance of a value at or between 0.5 nanohenries (nH) and 3 nH, and wherein the second inductor has an inductance value within a threshold tolerance of a value at or between 1 nH and 5 nH.

Aspect 24. The wireless device of any of aspects 20-23, wherein the first inductor is integrated in a laminate between the ground element and the acoustic die.

Aspect 25. The wireless device of any of aspects 20-24, further comprising a first filter, the first filter including the acoustic resonator, the first capacitor, the second capacitor, the first inductor, and the second inductor, wherein an input side of the first filter is connected to the first resonator side, and wherein an antenna side of the first filter is connected to a second side of the second inductor.

Aspect 26. The wireless device of aspect 25, further comprising: a second filter having a second filter antenna side connected to the antenna side of the first filter; and a third filter having a third filter antenna side connected to the antenna side of the first filter.

Aspect 27. The wireless device of aspect 26, wherein the second filter has a second filter passband range from 3.3 gigahertz (GHz) to 4.2 GHz, and wherein the third filter has a third filter passband range from 4.4 GHz to 5.0 GHz.

Aspect 28. The wireless device of any of aspects 19-27, wherein the acoustic resonator is a bulk acoustic wave resonator.

Aspect 29. The wireless device of any of aspects 19-27, wherein the acoustic resonator is a thin-film surface acoustic wave (SAW) resonator.

Aspect 30. The wireless device of any of aspects 19-27, wherein the wireless device is a cellular phone.

Aspect 31. The wireless device of any of aspects 19-29, wherein the wireless device is a laptop computer.

Aspect 32. The wireless device of aspect 19, further comprising a first filter, the first filter including the acoustic resonator, the first capacitor, the second capacitor, the first inductor, and the second inductor, wherein an input side of the first filter is connected to the first resonator side, and wherein an antenna side of the first filter is connected to a second side of the second inductor.

Aspect 33. The wireless device of aspect 32, further comprising a second filter having a second filter antenna side connected to the antenna side of the first filter.

Aspect 34. The wireless device of aspect 33, wherein the second filter has a second filter passband at a higher frequency range than a first filter passband associated with the first filter.

Aspect 35. A wireless device comprising: means for generating a resonance having a first resonator side and a second resonator side; processing circuitry coupled to the first resonator side; a first capacitor including a first side coupled to the first resonator side and the processing circuitry, the first capacitor further including a second side; a first inductor having a first side coupled to the second side of the first capacitor; a ground element coupled to a second side of the first inductor; a second capacitor including a first side coupled to a second side of the first inductor, the second capacitor further including a second side coupled to the second resonator side; a second inductor having a first side coupled the second resonator side and the second side of the second capacitor; and an antenna coupled to a second side of the second inductor.

Aspect 36. The wireless device of any of aspects 35, further comprising a first filter for a first frequency band, the first filter including the means for generating the resonance, the first capacitor, the second capacitor, the first inductor, and the second inductor, wherein an input side of the first filter is connected to the first resonator side, and wherein an antenna side of the first filter is connected to a second side of the second inductor.

Aspect 37. The wireless device of aspect 36, further comprising: means for filtering a second frequency band; means for filtering a third frequency band; and means for multiplexing an output of the first filter to a shared antenna with signals in the second frequency band, and signals in the third frequency band.

Aspect 38. The wireless device of any of aspects 35-37, wherein the wireless device is a cellular phone.

Aspect 39. The wireless device of any of aspects 35-37, wherein the wireless device is a laptop computer.

Aspect 40. A wireless communication apparatus comprising: an acoustic resonator having a first resonator side and a second resonator side; a first signal connection port coupled to the first resonator side; a first capacitor including a first side coupled to the first resonator side and the first signal connection port, the first capacitor further including a second side; a ground connection port coupled to the second side of the first capacitor; a second capacitor including a first side coupled to the ground connection port, the second capacitor further including a second side; and an output port coupled to the second resonator side and the second side of the second capacitor.

Aspect 41. A method comprising receiving the signal at a first filter of the wireless communication apparatus, the first filter including: an acoustic resonator having a first resonator side and a second resonator side; a first capacitor including a first side coupled to the first resonator side, the first capacitor further including a second side; a first inductor having a first side coupled to the second side of the first capacitor; a ground element coupled to a second side of the first inductor; a second capacitor including a first side coupled to a second side of the first inductor, the second capacitor further including a second side coupled to the second resonator side; a second inductor having a first side coupled the second resonator side and the second side of the second capacitor; and filtering the signal using the first filter, wherein filtering provides low phase delay filtering for a frequency band associated with the first filter.

Aspect 42. The method of aspect 41 using a wireless device or wireless communication apparatus in accordance with any aspect above.

Aspect 43. An apparatus comprising means for performing operations according to any aspect above.

Aspect 44. A non-transitory computer-readable storage medium comprising instructions stored thereon which, when executed by one or more processors, cause the one or more processors to manage operations of a device or apparatus according to any of aspect above.

Figure 12:
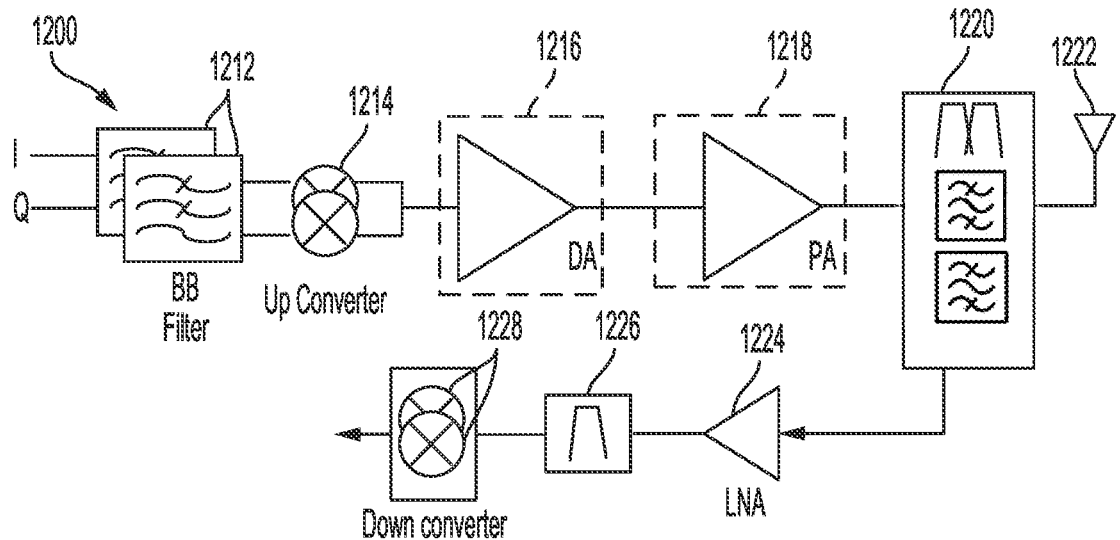
FIG. 12 is a functional block diagram of at least a portion of an example of a simplified wireless transceiver circuit in which the filter circuits and associated multiplexer structures described herein may be employed.

FIG. 12 is a functional block diagram of at least a portion of an aspect of a simplified wireless transceiver circuit 1200 in which the filter circuit 600 of FIG. 6 may be employed. The transceiver circuit 1200 is configured to receive signals/information for transmission (shown as I and Q values) which is provided to one or more base band filters 1212. The filtered output is provided to one or more mixers 1214. The output from the one or more mixers 1214 is provided to a driver amplifier 1216 whose output is provided to a power amplifier 1218 to produce an amplified signal for transmission. The amplified signal is output to the antenna 1222 through one or more filters 1220 (e.g., duplexers if used as a frequency division duplex transceiver or other filters). The one or more filters 1220 may include the filter circuit 600 of FIG. 6. The antenna 1222 may be used for both wirelessly transmitting and receiving data. The transceiver circuit 1200 includes a receive path through the one or more filters 1220 to be provided to a low noise amplifier (LNA) 1224 and a further filter 1226 and then down-converted from the receive frequency to a baseband frequency through one or more mixer circuits 1228 before the signal is further processed (e.g., provided to an analog digital converter and then demodulated or otherwise processed in the digital domain). There may be separate filters for the receive circuit (e.g., may have a separate antenna or have separate receive filters) that may be implemented using the filter circuit 600 of FIG. 6.

Figure 13:
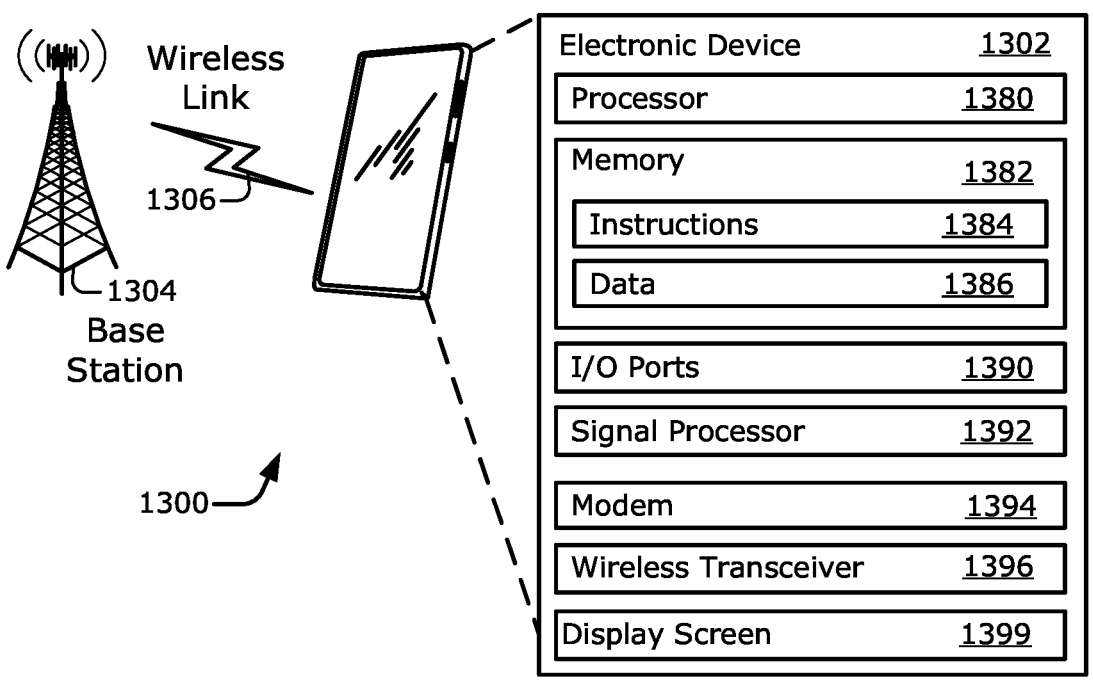
FIG. 13 is a diagram of an environment that includes an electronic device that includes a wireless transceiver such as the transceiver circuit of FIG. 12.

FIG. 13 is a diagram of an environment 1300 that includes an electronic device 1302 that includes a wireless transceiver 1396 such as the transceiver circuit 1200 of FIG. 12. In some aspects, the electronic device 1302 includes a display screen 1399 that can be used to display information associated with data transmitted via wireless link 1306 and processed using components of electronic device 1302 described below. Other aspects of an electronic device in accordance with aspects described herein using a low phase delay filter for multi-band communication can be configured without a display screen. In the environment 1300, the electronic device 1302 communicates with a base station 1304 through a wireless link 1306. As shown, the electronic device 1302 is depicted as a smart phone. However, the electronic device 1302 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, an automobile including a vehicle-based communication system, Internet of Things (IoT) device, sensor or security device, asset tracker, and so forth.

The base station 1304 communicates with the electronic device 1302 via the wireless link 1306, which may be implemented as any suitable type of wireless link. Although depicted as a base station tower of a cellular radio network, the base station 1304 may represent or be implemented as another device, such as a satellite, terrestrial broadcast tower, access point, peer to peer device, mesh network node, fiber optic line, another electronic device generally as described above, and so forth. Hence, the electronic device 1302 may communicate with the base station 1304 or another device via a wired connection, a wireless connection, or a combination thereof. The wireless link 1306 can include a downlink of data or control information communicated from the base station 1304 to the electronic device 1302 and an uplink of other data or control information communicated from the electronic device 1302 to the base station 1304. The wireless link 1306 may be implemented using any suitable communication protocol or standard, such as 3rd Generation Partnership Project Long-Term Evolution (3GPP LTE, 3GPP NR 5G), IEEE 802.11, IEEE 802.16, Bluetooth™, and so forth.

The electronic device 1302 includes a processor 1380 and a memory 1382. The memory 1382 may be or form a portion of a computer readable storage medium. The processor 1380 may include any type of processor, such as an application processor or a multi-core processor, that is configured to execute processor-executable instructions (e.g., code) stored by the memory 1382. The memory 1382 may include any suitable type of data storage media, such as volatile memory (e.g., random access memory (RAM)), non-volatile memory (e.g., Flash memory), optical media, magnetic media (e.g., disk or tape), and so forth. In the context of the disclosure, the memory 1382 is implemented to store instructions 1384, data 1386, and other information of the electronic device 1302, and thus when configured as or part of a computer readable storage medium, the memory 1382 does not include transitory propagating signals or carrier waves.

The electronic device 1302 may also include input/output ports 1390. The I/O ports 1390 enable data exchanges or interaction with other devices, networks, or users or between components of the device.

The electronic device 1302 may further include a signal processor (SP) 1392 (e.g., such as a digital signal processor (DSP)). The signal processor 1392 may function similar to the processor and may be capable executing instructions and/or processing information in conjunction with the memory 1382.

For communication purposes, the electronic device 1302 also includes a modem 1394, a wireless transceiver 1396, and an antenna (not shown). The wireless transceiver 1396 provides connectivity to respective networks and other electronic devices connected therewith using radio-frequency (RF) wireless signals and may include the transceiver circuit 1200 of FIG. 12. The wireless transceiver 1396 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

The various operations of methods described above may be performed by any suitable means capable of performing the corresponding functions. The means may include various hardware and/or software component(s) and/or module(s), including, but not limited to a circuit, an application-specific integrated circuit (ASIC), or processor.

By way of aspect, an element, or any portion of an element, or any combination of elements described herein may be implemented as a "processing system" that includes one or more processors. Aspects of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout the disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more aspect embodiments, the functions or circuitry blocks described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of aspect, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer. In some aspects, components described with circuitry may be implemented by hardware, software, or any combination thereof.

The phrase "coupled to" and the term "coupled" refers to any component that is physically connected to another component either directly or indirectly, and/or any component that is in communication with another component (e.g., connected to the other component over a wired or wireless connection, and/or other suitable communication interface) either directly or indirectly.

Generally, where there are operations illustrated in figures, those operations may have corresponding counterpart means-plus-function components with similar numbering.

As used herein, the term "determining" encompasses a wide variety of actions. For aspect, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an aspect, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A wireless communication apparatus comprising:
   a first filter comprising:
      an acoustic resonator having a first resonator side and a second resonator side, the first resonator side coupled to a first signal connection port;
      a first capacitor including a first side coupled to the first resonator side and the first signal connection port, the first capacitor further including a second side coupled to a ground connection port;
      a second capacitor including a first side coupled to the ground connection port, the second capacitor further including a second side, wherein the second resonator side and the second side of the second capacitor are coupled to an output port;
      a first inductor coupled between the ground connection port and a ground element; and
      a second inductor coupled to the output port;
      wherein the first filter has an out-of-band frequency range from 3.3 gigahertz (GHz) to 5 GHz with a reflection parameter for the out-of-band frequency range being within a threshold tolerance of an open condition;
   a second filter having a second filter antenna side connected to an antenna side of the first filter and a second filter passband range from approximately 3.3 GHz to 4.2 GHz; and
   a third filter having a third filter antenna side connected to the antenna side of the first filter and a third filter passband range from approximately 4.4 GHz to 5.0 GHz.

2. The wireless communication apparatus of claim 1, wherein the first inductor has an inductance value within a threshold tolerance between 0.5 nanohenries (nH) and 3 nH, and wherein the second inductor has an inductance value within a threshold tolerance between 1 nH and 5 nH.

3. The wireless communication apparatus of claim 1, wherein the first inductor is integrated in a laminate between the ground element and an acoustic die.

4. The wireless communication apparatus of claim 1, wherein an input side of the first filter is connected to the first resonator side, and wherein the antenna side of the first filter is connected to a second side of the second inductor.

5. The wireless communication apparatus of claim 4, wherein the first filter has a passband within a threshold tolerance of in a range between 1 gigahertz (GHz) and 2.69 GHz.

6. The wireless communication apparatus of claim 4, wherein the first filter has an out-of-band frequency range from 3.3 gigahertz (GHz) to 5 GHz with a transmission parameter for the out-of-band frequency range being less than −15 decibels (dB).

7. The wireless communication apparatus of claim 1, wherein the first capacitor has a first capacitance value within a threshold tolerance of a range from 0.1 picofarads (pF) to 0.7 pF, and wherein the second capacitor has a second capacitance value within the threshold tolerance of the range from 0.1 pF to 0.7 pF.

8. The wireless communication apparatus of claim 7, wherein the threshold tolerance is five percent.

9. The wireless communication apparatus of claim 1, wherein the acoustic resonator is a bulk acoustic wave resonator.

10. The wireless communication apparatus of claim 1, wherein the acoustic resonator is a surface acoustic wave (SAW) resonator.

11. The wireless communication apparatus of claim 1, further comprising an antenna coupled to the output port.

12. The wireless communication apparatus of claim 1, wherein the wireless communication apparatus is an electrical filter component integrated on an acoustic die.

13. A wireless device comprising:
   a first filter configured to provide low phase delay filtering for a frequency band associated with the first filter, the first filter comprising:
      an acoustic resonator having a first resonator side and a second resonator side;
      processing circuitry coupled to the first resonator side;
      a first capacitor including a first side coupled to the first resonator side and the processing circuitry, the first capacitor further including a second side;
      a first inductor having a first side coupled to the second side of the first capacitor;
      a ground element coupled to a second side of the first inductor;
      a second capacitor including a first side coupled to a second side of the first inductor, the second capacitor further including a second side coupled to the second resonator side; and
      a second inductor having a first side coupled the second resonator side and the second side of the second capacitor.

14. The wireless device of claim 13, further comprising a first filter, the first filter including the acoustic resonator, the first capacitor, the second capacitor, the first inductor, and the second inductor, wherein an input side of the first filter is connected to the first resonator side, and wherein an antenna side of the first filter is connected to a second side of the second inductor.

15. The wireless device of claim 14, further comprising a second filter having a second filter antenna side connected to the antenna side of the first filter.

16. The wireless device of claim 15, wherein the second filter has a second filter passband at a higher frequency range than a first filter passband associated with the first filter.

17. The wireless device of claim 15, further comprising a third filter having a third filter antenna side connected to the antenna side of the first filter.

18. The wireless device of claim 17, wherein the second filter has a second filter passband range from 3.3 gigahertz (GHz) to 4.2 GHz, and wherein the third filter has a third filter passband range from 4.4 GHz to 5.0 GHz.

19. The wireless device of claim 13, wherein the acoustic resonator, the first capacitor, and the second capacitor are integrated in an acoustic die.

20. The wireless device of claim 13, wherein the first capacitor has a first capacitance value within a threshold tolerance of a range from 0.1 picofarads (pF) to 0.7 pF, and wherein the second capacitor has a second capacitance value within the threshold tolerance from 0.1 pF to of 0.7 pF.

21. The wireless device of claim 13, wherein the first inductor has an inductance value within a threshold tolerance of a value at or between 0.5 nanohenries (nH) and 3 nH, and wherein the second inductor has an inductance value within a threshold tolerance of a value at or between 1 nH and 5 nH.

22. The wireless device of claim 13, wherein the first inductor is integrated in a laminate between the ground element and an acoustic die.

23. The wireless device of claim 13, wherein the acoustic resonator is a surface acoustic wave (SAW) resonator.

24. The wireless device of claim 13, wherein the wireless device is a cellular phone.

25. A method of filtering a signal in a wireless communication apparatus, the method comprising:
receiving the signal at a first filter of the wireless communication apparatus, the first filter including:
an acoustic resonator having a first resonator side and a second resonator side;
a first capacitor including a first side coupled to the first resonator side, the first capacitor further including a second side;
a first inductor having a first side coupled to the second side of the first capacitor;
a ground element coupled to a second side of the first inductor;
a second capacitor including a first side coupled to a second side of the first inductor, the second capacitor further including a second side coupled to the second resonator side; and
a second inductor having a first side coupled the second resonator side and the second side of the second capacitor; and
filtering the signal using the first filter, wherein filtering provides low phase delay filtering for a frequency band associated with the first filter.

* * * * *